(12) United States Patent
Hayashi et al.

(10) Patent No.: US 8,415,201 B2
(45) Date of Patent: Apr. 9, 2013

(54) DICING TAPE-INTEGRATED FILM FOR SEMICONDUCTOR BACK SURFACE

(75) Inventors: Miki Hayashi, Ibaraki (JP); Naohide Takamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 114 days.

(21) Appl. No.: 12/814,743

(22) Filed: Jun. 14, 2010

(65) Prior Publication Data

US 2010/0314781 A1 Dec. 16, 2010

(30) Foreign Application Priority Data

Jun. 15, 2009 (JP) ................. 2009-142231
Apr. 28, 2010 (JP) ................. 2010-103964

(51) Int. Cl.
*H01L 21/00* (2006.01)

(52) U.S. Cl.
USPC ......................................... 438/108

(58) Field of Classification Search ............ 257/778, 257/E23.01, E21.599; 438/113, 118, 413, 438/108, 112, 126

See application file for complete search history.

(56) References Cited

U.S. PATENT DOCUMENTS

| | | | | |
|---|---|---|---|---|
| 6,245,593 | B1 * | 6/2001 | Yoshihara et al. | 438/106 |
| 2003/0064579 | A1 * | 4/2003 | Miyakawa et al. | 438/628 |
| 2005/0208736 | A1 * | 9/2005 | Matsumura et al. | 438/460 |
| 2010/0219507 | A1 * | 9/2010 | Misumi et al. | 257/618 |

FOREIGN PATENT DOCUMENTS

| | | |
|---|---|---|
| JP | 2004-63551 A | 2/2004 |
| JP | 2004-72108 A | 3/2004 |
| JP | 2004-142430 A | 5/2004 |
| JP | 2004-214288 A | 7/2004 |
| JP | 2004-221169 A | 8/2004 |
| JP | 2007-158026 A | 6/2007 |
| JP | 2007-250970 A | 9/2007 |
| JP | 2007-261035 A | 10/2007 |
| JP | 2008-6386 A | 1/2008 |
| JP | 2008-166451 A | 7/2008 |
| WO | WO2007/094418 * | 8/2007 |

* cited by examiner

*Primary Examiner* — Nikolay Yushin
(74) *Attorney, Agent, or Firm* — Sughrue Mion, PLLC

(57) ABSTRACT

The present invention provides a dicing tape-integrated film for semiconductor back surface, including: a dicing tape including a base material and a pressure-sensitive adhesive layer provided on the base material; and a film for flip chip type semiconductor back surface provided on the pressure-sensitive adhesive layer, in which the film for flip chip type semiconductor back surface has a storage elastic modulus (at 60° C.) of from 0.9 MPa to 15 MPa.

4 Claims, 2 Drawing Sheets

DICING TAPE-INTEGRATED FILM FOR SEMICONDUCTOR BACK SURFACE

FIELD OF THE INVENTION

The present invention relates to a dicing tape-integrated film for semiconductor back surface which includes a film for flip chip type semiconductor back surface. The film for flip chip type semiconductor back surface is used for the purposes of protecting a back surface of a chip-shaped workpiece (such as a semiconductor chip) and enhancing strength and the like. Also, the invention relates to a process for producing a semiconductor device using a dicing tape-integrated film for semiconductor back surface and a flip chip-mounted semiconductor device.

BACKGROUND OF THE INVENTION

In recent years, thinning and miniaturization of a semiconductor device and its package have been increasingly demanded. Therefore, as the semiconductor device and its package, semiconductor devices of a flip chip type in which a chip-shaped workpiece such as a semiconductor chip is mounted (flip chip-bonded) on a substrate by means of flip chip bonding have been widely utilized. In such flip chip bonding, a semiconductor chip is fixed to a substrate in a form where a circuit face of the semiconductor chip is opposed to an electrode-formed face of the substrate. In such a semiconductor device or the like, there may be a case where the back surface of the semiconductor chip (chip-shaped workpiece) is protected with a protective film to inhibit the semiconductor chip from damaging or the like (see, for example, Patent Documents 1 to 10).

Patent Document 1: JP-A-2008-166451
Patent Document 2: JP-A-2008-006386
Patent Document 3: JP-A-2007-261035
Patent Document 4: JP-A-2007-250970
Patent Document 5: JP-A-2007-158026
Patent Document 6: JP-A-2004-221169
Patent Document 7: JP-A-2004-214288
Patent Document 8: JP-A-2004-142430
Patent Document 9: JP-A-2004-072108
Patent Document 10: JP-A-2004-063551

SUMMARY OF THE INVENTION

However, the attachment of a back surface protective film for protecting a back surface of a semiconductor chip to the back surface of the semiconductor chip obtained by dicing a semiconductor wafer in a dicing step results in the addition of a step for the attachment, so that the number of steps increases and cost and the like increase. Moreover, owing to the thinning, the semiconductor chip may be damaged in some cases in a picking-up step of the semiconductor chip after the dicing step. Thus, it is desired to reinforce the semiconductor wafer or semiconductor chip before the picking-up step.

In consideration of the foregoing problem, an object of the present invention is to provide a dicing tape-integrated film for semiconductor back surface capable of being utilized from the dicing step of the semiconductor wafer to the flip chip bonding step of the semiconductor element.

Moreover, another object of the invention is to provide a dicing tape-integrated film for semiconductor back surface capable of exhibiting an excellent holding force in the dicing step of the semiconductor wafer and capable of exhibiting an excellent marking property and an excellent appearance property after the flip chip connecting step of the semiconductor element.

In order to solve the foregoing related-art problems, the present inventors made extensive and intensive investigations. As a result, it has been found that when a film for flip chip type semiconductor back surface is laminated on a pressure-sensitive adhesive layer of a dicing tape having a base material and the pressure-sensitive adhesive layer so as to form the dicing tape and the film for flip chip type semiconductor back surface in an integrated form, and the film for flip chip type semiconductor back surface is formed of a resin composition containing a thermoplastic resin composition in a specified ratio, a laminate (dicing tape-integrated film for semiconductor back surface) in which the dicing tape and the film for flip chip type semiconductor back surface are formed in an integrated form can be utilized from a dicing step of a semiconductor wafer to a flip chip connection step of a semiconductor element, an excellent holding force can be exhibited in the dicing step of a semiconductor wafer, and an excellent marking property and an excellent appearance property can be exhibited after the flip chip connection step of a semiconductor element, leading to accomplishment of the invention.

Namely, the present invention provides a dicing tape-integrated film for semiconductor back surface, comprising:

a dicing tape including a base material and a pressure-sensitive adhesive layer provided on the base material; and a film for flip chip type semiconductor back surface provided on the pressure-sensitive adhesive layer, wherein the film for flip chip type semiconductor back surface has a storage elastic modulus (at 60° C.) of from 0.9 MPa to 15 MPa As above, the dicing tape-integrated film for semiconductor back surface of the invention is formed in a form in which the film for flip chip type semiconductor back surface is integrated with the dicing tape having the base material and the pressure-sensitive adhesive layer, and the storage elastic modulus (at 60° C.) of the film for flip chip type semiconductor back surface is from 0.9 MPa to 15 MPa. Therefore, by attaching the dicing tape-integrated film for semiconductor back surface onto a workpiece (semiconductor wafer) at dicing a wafer (semiconductor wafer), the workpiece can be effectively diced while being held. Also, after the workpiece is diced to form a chip-shaped workpiece (semiconductor element), the chip-shaped workpiece can be easily peeled from the pressure-sensitive adhesive layer of the dicing tape with an excellent picking-up property together with the film for flip chip type semiconductor back surface, and the back surface-protected chip-shaped workpiece can be easily obtained. Moreover, a marking property, an appearance property and the like of the back surface of the chip-shaped workpiece can be effectively enhanced.

In particular, as described previously, in the dicing tape-integrated film for semiconductor back surface of the invention, the dicing tape and the film for flip chip type semiconductor back surface are formed in an integrated form, and therefore, the dicing tape-integrated film for semiconductor back surface of the invention can also be provided for a dicing step of dicing a semiconductor wafer to prepare a semiconductor element or a subsequent picking-up step. As a result, a step of attaching only a film for semiconductor back surface (attaching step of a film for semiconductor back surface) is not required. Furthermore, in the subsequent dicing step or picking-up step, the film for semiconductor back surface is attached to the back surface of the semiconductor wafer or the back surface of the semiconductor element formed by dicing, and therefore, the semiconductor wafer or the semiconductor element can be effectively protected, and the damage of the semiconductor element in the dicing step or subsequent steps (for example, the picking-up step) can be suppressed or prevented.

In an embodiment, the film for flip chip type semiconductor back surface contains a coloring agent added thereto. In an embodiment, the dicing tape-integrated film for semiconductor back surface of the invention can be suitably used at the time of flip chip bonding. Also, since the film for flip chip type semiconductor back surface attaches to the back surface of the semiconductor element with excellent close adhesion, it has an excellent appearance property. Furthermore, an excellent marking property can be imparted to the back surface of the semiconductor element.

The present invention also provides a process for producing a semiconductor device using the above-mentioned dicing tape-integrated film for semiconductor back surface, the process comprising:

attaching a workpiece onto the film for flip chip type semiconductor back surface of the dicing tape-integrated film for semiconductor back surface, dicing the workpiece to form a chip-shaped workpiece, peeling the chip-shaped workpiece from the pressure-sensitive adhesive layer of the dicing tape together with the film for flip chip type back surface, and flip chip connecting the chip-shaped workpiece onto an adherend.

The present invention further provides a flip chip-mounted semiconductor device, which is manufactured by the above-mentioned process.

According to the dicing tape-integrated film for semiconductor back surface of the invention, not only the dicing tape and the film for flip chip type semiconductor back surface are formed in an integrated form, but the storage elastic modulus (at 60° C.) of the film for flip chip type semiconductor back surface is from 0.9 MPa to 15 MPa. Therefore, the dicing tape-integrated film for semiconductor back surface of the invention can be utilized from a dicing step of a semiconductor wafer to a flip chip bonding step of a semiconductor element. Specifically, the dicing tape-integrated film for semiconductor back surface of the invention can exhibit an excellent holding force in the dicing step of a semiconductor wafer, and the semiconductor element by dicing can be peeled from the pressure-sensitive adhesive layer of the dicing tape with an excellent picking-up property together with the film for flip chip type semiconductor back surface in a picking-up step after the dicing step. Furthermore, a marking property and an appearance property can be exhibited during and after the flip chip bonding step of a semiconductor element. Also, in the flip chip bonding step and the like, since the back surface of the semiconductor element is protected with the film for flip chip type semiconductor back surface, breakage, chipping, warp and the like of the semiconductor element can be effectively suppressed or prevented. Furthermore, even when the semiconductor element whose back surface is protected with the film for flip chip type semiconductor back surface is placed on a support after the picking-up step and up to the flip chip bonding step, the semiconductor element is not attached to the support. As a matter of course, the dicing tape-integrated film for semiconductor back surface of the invention can effectively exhibit its functions in steps other than the steps of from the dicing step to the flip chip bonding step of a semiconductor element.

DESCRIPTION OF REFERENCE NUMERALS AND SIGNS

Figure 1:
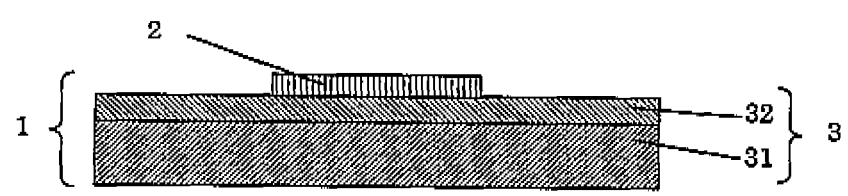
FIG. 1 is a cross-sectional schematic view showing one embodiment of a dicing tape-integrated film for semiconductor back surface of the invention.

1: Dicing tape-integrated film for semiconductor back surface
2: Film for flip chip type semiconductor back surface
3: Dicing tape
31: Base material
32: Pressure-sensitive adhesive layer
4: Semiconductor wafer (workpiece)
5: Semiconductor element (semiconductor chip)
51: Bump formed at circuit face of semiconductor chip 5
6: Adherend
61: Conductive material for conjunction adhered to connecting pad of adherend 6

DETAILED DESCRIPTION OF THE INVENTION

Dicing Tape-Integrated Film for Semiconductor Back Surface

An embodiment of the invention is described with reference to FIG. 1, but the invention is not restricted to this embodiment, FIG. 1 is a sectional schematic view showing an embodiment of a dicing tape-integrated film for semiconductor back surface of the invention. In FIG. 1, 1 is a dicing tape-integrated film for semiconductor back surface (hereinafter sometimes also referred to as "dicing tape-integrated semiconductor back surface protective film", "film for semiconductor back surface with dicing tape", or "semiconductor back surface protective film with dicing tape"); 2 is a film for flip chip type semiconductor back surface (hereinafter sometimes also referred to as "film for semiconductor back surface" or "semiconductor back surface protective film"); 3 is a dicing tape; 31 is a base material; and 32 is a pressure-sensitive adhesive layer.

Incidentally, in the figures in the present specification, parts that are unnecessary for the description are not given, and there are parts shown by magnifying, minifying, etc. in order to make the description easy.

As shown in FIG. 1, the dicing tape-integrated film for semiconductor back surface 1 has a configuration including the dicing tape 3 having the pressure-sensitive adhesive layer 32 formed on the base material 31 and the film for semiconductor back surface 2 provided on the pressure-sensitive adhesive layer 32. The film for semiconductor back surface 2 has a storage elastic modulus (at 60° C.) of from 0.9 MPa to 15 MPa. The surface of the film for semiconductor back surface 2 (surface to be attached to the back surface of the semiconductor wafer) may be protected with a separator or the like during the period until it is attached to the back surface of the semiconductor wafer.

Also, the dicing tape-integrated film for semiconductor back surface 1 may have a configuration in which the film for semiconductor back surface 2 is formed on the pressure-sensitive adhesive layer 32 of the dicing tape 3 over the whole surface or may have a configuration in which the film for semiconductor back surface 2 is partially formed. For example, as shown in FIG. 1, the dicing tape-integrated film for semiconductor back surface 1 may have a configuration in which the film for semiconductor back surface 2 is formed only on a portion of the pressure-sensitive adhesive layer 32 of the dicing tape 3, to which the semiconductor wafer is to be attached.

Film for Flip Chip Type Semiconductor Back Surface

The film for semiconductor back surface 2 has a film shape. As described previously, since the film for semiconductor back surface 2 has a storage elastic modulus (at 60° C.) of from 0.9 MPa to 15 MPa, in a cut-processing step (dicing step) of cutting a semiconductor wafer attached onto the film for semiconductor back surface 2 into a chip shape, the film for semiconductor back surface 2 has a function of supporting the semiconductor wafer with close adhesion thereto and is able to exhibit adhesiveness such that cut pieces are not scattered. Also, in a picking-up step after the dicing step, the diced semiconductor element can be easily peeled from the dicing tape 3 together with the film for semiconductor back surface 2. Furthermore, after the picking-up step (after the diced semiconductor element is peeled from the dicing tape 3 together with the film for semiconductor back surface 2), the film for semiconductor back surface 2 can have functions of protecting the back surface of the semiconductor element (semiconductor chip) and also exhibiting an excellent marking property and an excellent appearance property.

As above, since the film for semiconductor back surface 2 has an excellent marking property, marking can be performed to impart various kinds of information such as literal information and graphical information to the face on the non-circuit side of a semiconductor element or a semiconductor device using the semiconductor element by utilizing a printing method or a laser marking method through the film for semiconductor back surface 2. In particular, when the film for semiconductor back surface 2 is colored, by controlling the color of coloring, it becomes possible to observe the information (for example, literal information and graphical information) imparted by marking with excellent visibility. Also, when the film for semiconductor back surface 2 is colored, the dicing tape 3 and the film for semiconductor back surface 2 can be easily distinguished from each other, and workability and the like can be enhanced.

In particular, since the film for semiconductor back surface 2 has excellent close adhesion to the semiconductor wafer or the semiconductor chip, lifting or the like is not observed. Also, since the film for semiconductor back surface 2 can exhibit an excellent appearance property, a semiconductor device having an excellent value-added appearance property can be obtained. For example, as a semiconductor device, it is possible to classify products thereof by using different colors.

It is important that the film for semiconductor back surface 2 has adhesiveness (close adhesion) such that cut pieces are not scattered at cut-processing of the semiconductor wafer.

As above, the film for semiconductor back surface 2 is used not for die-bonding a semiconductor chip to an adherend such as a substrate but for protecting the back surface (non-circuit face) of a semiconductor chip to be flip chip mounted (or having been flip chip mounted) and has optimal function and constitution therefor. In this regard, a die bonding film is an adhesive layer which is used for an application of strongly adhering the semiconductor chip onto the adherend such as a substrate. Also, in the semiconductor device using a die bonding film, since it is finally encapsulated with an encapsulating resin, the die bonding film is different in function and constitution from the film for semiconductor back surface 2 of the invention aiming to protect the back surface of each of the semiconductor wafer and the semiconductor chip. Accordingly, it is not preferable that the film for semiconductor back surface 2 of the invention is used as a die bonding film.

As described previously, in the invention, it is important that the storage elastic modulus (at 60° C.) of the film for semiconductor back surface 2 is from 0.9 MPa to 15 MPa. Although an upper limit of the storage elastic modulus (at 60° C.) of the film for semiconductor back surface 2 may be not more than 15 MPa, it is preferably not more than 12 MPa, and more preferably not more than 10 MPa. Also, the upper limit of the storage elastic modulus (at 60° C.) of the film for semiconductor back surface 2 may be not more than 8 MPa, and it is especially preferably not more than 5 MPa. Above all, the upper limit of the storage elastic modulus (at 60° C.) of the film for semiconductor back surface 2 is suitably not more than 3 MPa. On the other hand, although a lower limit of the storage elastic modulus (at 60° C.) of the film for semiconductor back surface 2 may be 0.9 MPa or more, it is preferably 1 MPa or more, and especially preferably 1.2 MPa or more. Accordingly, the storage elastic modulus (at 60° C.) of the film for semiconductor back surface 2 may be, for example, from 0.9 MPa to 12 MPa and may also be from 0.9 MPa to 10 MPa. When the storage elastic modulus (at 60° C.) of the film for semiconductor back surface 2 exceeds 15 MPa, the close adhesion to the wafer is lowered, and the holding force of the semiconductor wafer in the dicing step is lowered. On the other hand, when the storage elastic modulus (at 60° C.) of the film for semiconductor back surface 2 is less than 0.9 MPa, the elastic modulus is too low so that in the picking-up step, a peeling property at an interface between the film for semiconductor back surface 2 and the pressure-sensitive adhesive layer 32 of the dicing tape 3 is lowered and that the picking-up property is lowered.

The storage elastic modulus (tensile storage elastic modulus E') at 60° C. of the film for semiconductor back surface 2 is determined by preparing the film for semiconductor back surface 2 without being laminated on the dicing tape and measuring a storage elastic modulus in a tensile mode under conditions of a sample width of 10 mm, a sample length of 22.5 mm, a sample thickness of 0.2 mm, a frequency of 1 Hz and a temperature elevating rate of 10° C./min under a nitrogen atmosphere at a prescribed temperature (60° C.) using a dynamic viscoelasticity measuring apparatus "Solid Analyzer RS A2", manufactured by Rheometrics Co., Ltd. and is regarded as a value of obtained tensile storage elastic modulus E'.

In the invention, the film for semiconductor back surface 2 is preferably constituted of a resin composition containing a thermoplastic resin and a thermosetting resin. The film for semiconductor back surface 2 may be constituted of a thermoplastic resin composition which is free from a thermosetting resin or may be constituted of a thermosetting resin composition which is free from a thermoplastic resin.

Examples of the thermoplastic resin include natural rubber, butyl rubber, isoprene rubber, chloroprene rubber, an ethylene-vinyl acetate copolymer, an ethylene-acrylic acid copolymer, an ethylene-acrylic acid ester copolymer, a polybutadiene resin, a polycarbonate resin, a thermoplastic polyimide resin, a polyamide resin such as 6-nylon and 6,6-nylon, a phenoxy resin, an acrylic resin, a saturated polyester resin such as PET (polyethylene telephtalate) and PBT (polybutylene telephtalate), a polyamide-imide resin and a fluorocarbon resin. The thermoplastic resin may be used singly or in combinations of two or more kinds thereof. Among these thermoplastic resins, an acrylic resin containing a small amount of ionic impurities, having high heat resistance and capable of securing reliability of a semiconductor element is especially preferable.

The acrylic resins are not particularly restricted, and examples thereof include polymers containing one kind or two or more kinds of alkyl esters of acrylic acid or methacrylic acid in which the alkyl group is a straight chain or branched alkyl group having 30 or less carbon atoms, especially 4 to 18 carbon atoms as component(s). Namely, "acrylic resin" as used herein has a broad meaning of including methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid in which the alkyl group is one having 30 or less carbon atoms) are not particularly restricted, and examples thereof include carboxyl group-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)-methylacrylate; sulfonic acid-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalenesulfonic acid; and phosphoric acid group-containing monomers such as 2-hydroxyethylaoryloyl phosphate.

Examples of the thermosetting resin include, in addition to an epoxy resin and a phenol resin, an amino resin, an unsaturated polyester resin, a polyurethane resin, a silicone resin and a thermosetting polyimide resin. The thermosetting resin may be used singly or in combinations of two or more kinds thereof. As the thermosetting resin, an epoxy resin containing a small amount of ionic impurities which corrode a semiconductor element is suitable. Also, the phenol resin can be suitably used as a curing agent of the epoxy resin.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin and a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, bisphenol A type epoxy resin, a novolak type epoxy resin, a biphenyl type epoxy resin, a trishydroxyphenylmethane type epoxy resin, and a tetraphenylolethane type epoxy resin are preferable. This is because these epoxy resins have high reactivity with a phenol resin as a curing agent and are superior in heat resistance and the like.

Furthermore, the above-mentioned phenol resin acts as a curing agent of the epoxy resin, and examples thereof include novolak type phenol resins such as phenol novolak resins, phenol aralkyl resins, cresol novolak resins, tert-butylphenol novolak resins, and nonylphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are particularly preferable. This is because connection reliability of the semiconductor device can be improved.

The mixing ratio of the epoxy resin to the phenol resin is preferably made, for example, such that the hydroxyl group in the phenol resin becomes 0.5 to 2.0 equivalents per equivalent of the epoxy group in the epoxy resin component. It is more preferably 0.8 to 1.2 equivalents. That is when the mixing ratio becomes outside the range, a curing reaction does not proceed sufficiently, and the characteristics of the epoxy resin cured product tends to deteriorate.

A thermal curing-accelerating catalyst for the epoxy resins and the phenol resins is not particularly restricted and can be suitably selected from known thermal curing-accelerating catalysts and used. The thermal curing-accelerating catalyst may be employed singly or in a combination of two or more kinds. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

In the invention, it is especially preferable that the film for semiconductor back surface 2 is formed of a resin composition (resin composition for DBF) containing an epoxy resin, a phenol resin and an acrylic resin. Since these resins are small in ionic impurities and high in heat resistance, reliability of a semiconductor element can be secured. In this case, although a blending ratio of these resins is not particularly limited, for example, a mixing amount of the epoxy resin and the phenol resin can be selected within the range of from 10 parts by weight to 300 parts by weight (preferably from 15 parts by weight to 280 parts by weight, and more preferably from 20 parts by weight to 250 parts by weight) based on 100 parts by weight of the acrylic resin component.

It is important that the film for semiconductor back surface 2 has adhesiveness (close adhesion) to the back surface (non-circuit face) of the semiconductor wafer. The film for semiconductor back surface having such close adhesion or the like can be for example, formed of a resin composition containing an epoxy resin. For the purpose of crosslinking the film for semiconductor back surface 2, a polyfunctional compound capable of reacting with a molecular chain terminal functional group or the like of a polymer can be added as a crosslinking agent thereto. According to this, it is possible to contrive to enhance an adhesive characteristic (close adhesion characteristic) at high temperatures and to improve heat resistance.

The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned. As the crosslinking agent, an isocyanate-based crosslinking agent or an epoxy-based crosslinking agent is suitable. The crosslinking agent may be employed singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [trade name "COLONATE L" manufactured by Nippon Polyurethane Industry Co., Ltd.], a trimethylolpropane/hexamethylene diisocyanate trimer adduct [trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

The amount of the crosslinking agent is not particularly restricted and can be appropriately selected depending on the degree of the crosslinking. Specifically, it is preferable that the amount of the crosslinking agent is, for example, 0.05 to 7 parts by weight based on 100 parts by weight of the polymer components (particularly, a polymer having a functional group at the molecular chain end). When the amount of the crosslinking agent is more than 7 parts by weight based on 100 parts by weight of the polymer components, the close adhesiveness is lowered and thus unfavorable, whereas when it is less than 0.05 parts by weight, the cohesive force is not sufficient and thus unfavorable.

In the invention, instead of the use of the crosslinking agent or together with the use of the crosslinking agent, it is also possible to perform the crosslinking treatment by irradiation with an electron beam or ultraviolet light.

In the invention, it is preferable that the film for semiconductor back surface 2 is colored. As above, in the case where the film for semiconductor back surface 2 is colored (the case where the film for semiconductor back surface 2 is neither colorless nor transparent), the color shown by coloring is not particularly limited but, for example, is preferably dark color such as black, blue or red color, and black color is especially preferable.

In the invention, dark color basically means a dark color having L*, defined in L*a*b* color space, of 60 or smaller (from 0 to 60), preferably 50 or smaller (from 0 to 50), and more preferably 40 or smaller (from 0 to 40).

Moreover, black color basically means a black-based color having L*, defined in L*a*b* color space, of 35 or smaller (from 0 to 35), preferably 30 or smaller (from 0 to 30), and more preferably 25 or smaller (from 0 to 25). In this regard, in the black color, each of a* and b*, defined in the L*a*b* color space, can be suitably selected according to the value of L*. For example, both of a* and b* are within the range of preferably from −10 to 10, more preferably from −5 to 5, and especially preferably −3 to 3 (particularly 0 or about 0).

In the invention, L*, a* and b* defined in the L*a*b* color space can be determined by a measurement with a color difference meter (trade name "CR-200" manufactured by Minolta Ltd; color difference meter). The L*a*b* color space is a color space recommended by the Commission Internationale de l'Eclairage (CIE) in 1976, and means a color space called CIE1976(L*a*b*) color space. Also, the L*a*b* color space is defined in Japanese Industrial Standards in JIS Z8729.

At coloring of the film for semiconductor back surface 2, according to an objective color, a colorant (coloring agent) can be used. As such a colorant, various dark-colored colorants such as black-colored colorants, blue-colored colorants, and red-colored colorants can be suitably used and black-colored colorants are especially suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly restricted and can be suitably selected and used among known pigments.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colorant colorant (yellow colorant) are mixed. The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite, copper oxide, manganese dioxide, azo-type pigment (e.g., azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

As the colorant other than black-colored colorant, for example, a cyan-colored colorant, a magenta-colored colorant, and a yellow-colorant colorant may be mentioned. Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 66; C.I. Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as C.I. Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case that two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

Incidentally, in the case that the black-colored colorant is a colorant mixture formed by mixing a cyan-colored colorant, a magenta-colored colorant and a yellow-colored colorant, these colorants may be used singly or in a combination of two or more kinds. The mixing ratio (or blending ratio) of the cyan-colored colorant, the magenta-colored colorant and the yellow-colored colorant in the mixed ink composition is not particularly restricted as long as a black-based color (e.g., a black-based color having L*, a*, and b*, defined in L*a*b* color space, within the above ranges) can be exhibited, and may be suitably selected according to the type of each colorant and the like. The contents of the cyan-colored colorant, the magenta-colored colorant and the yellow-colored colorant in the mixed ink composition can be suitably selected, for example, within a range, with respect to the total amount of the colorants, of cyan-colored colorant/magenta-colored colorant/yellow-colored colorant=10% by weight to 50% by weight/10% by weight to 50% by weight/10% by weight to 50% by weight (preferably 20% by weight to 40% by weight/ 20% by weight to 40% by weight/20% by weight to 40% by weight).

As the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can be utilized.

As such black-colored colorants, for example, trade name "Oil Black BY", trade name "Oil Black BS", trade name "Oil Black HBB", trade name "Oil Black 803", trade name "Oil Black 860", trade name "Oil Black 5970", trade name "Oil Black 5906", trade name "Oil Black 5905" (manufactured by Orient Chemical Industries Co., Ltd.), and the like are commercially available.

In the film for semiconductor back surface 2, if desired, other additives may be properly blended. Examples of other additives include an extender, an antiaging agent, an antioxidant and a surfactant in addition to a filler, a flame retardant, a silane coupling agent and an ion-trapping agent.

The filler may be any of an inorganic filler and an organic filler but an inorganic filler is suitable. By blending a filler such as an inorganic filler, imparting of electric conductivity to the film for semiconductor back surface 2, improvement of the thermal conductivity of the film for semiconductor back surface 2, control of elastic modulus of the film for semiconductor back surface 2, and the like can be achieved. In this regard, the film for semiconductor back surface 2 may be electrically conductive or non-conductive. Examples of the inorganic filler include various inorganic powders composed of silica, clay, gypsum, calcium carbonate, barium sulfate, alumina oxide, beryllium oxide, ceramics such as silicone carbide and silicone nitride, metals or alloys such as aluminum, copper, silver, gold, nickel, chromium, lead, tin, zinc, palladium, and solder, carbon, and the like. The filler may be employed singly or in a combination of two or more kinds. Particularly, the filler is suitably silica and especially suitably fused silica. The average particle diameter of the inorganic filler is preferably within the range of 0.1 μn to 80 μm. The average particle diameter of the inorganic filler can be measured by a laser diffraction-type particle size distribution measurement apparatus.

A blending amount of the filler (in particular, an inorganic filler) is preferably not more than 80 parts by weight (for example, from 0 part by weight to 80 parts by weight), and especially preferably from 0 part by weight to 70 parts by weight, based on 100 parts by weight of the resin components.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

The film for semiconductor back surface 2 can be, for example, formed by utilizing a customary method in which a thermosetting resin component such as an epoxy resin, a thermoplastic resin component such as an acrylic resin and a coloring material (coloring agent) and optionally, a solvent and other additives and the like are mixed to prepare a resin composition, which is then formed in a film-shaped layer. Specifically, for example, the film-shaped layer as the film for semiconductor back surface 2 can be formed by a method of coating the resin composition on the pressure-sensitive adhesive layer 32 of the dicing tape 3; a method of coating the resin composition on an appropriate separator (for example, a release paper) to form a resin layer, which is then transferred (transcribed) onto the pressure-sensitive adhesive layer 32 of the dicing tape 3; or the like.

In the case where the film for semiconductor back surface 2 is formed of a resin composition containing a thermosetting resin component such as an epoxy resin, in the film for semiconductor back surface 2, the thermosetting resin is in an uncured or partially cured state at a stage before it is applied to a semiconductor wafer. In this case, after it is applied to the semiconductor wafer (specifically, in general, at the time when an encapsulating material is cured in the flip chip bonding step), the thermosetting resin component in the film for semiconductor back surface 2 is completely or almost completely cured.

As above, since the film for semiconductor back surface 2 is in a state in which the thermosetting resin component is uncured or partially cured even though the film contains a thermosetting resin component, a gel fraction of the film for semiconductor back surface 2 is not particularly restricted but can be, for example, suitably selected within the range of not more than 50% by weight (from 0% by weight to 50% by weight), and it is preferably not more than 30% by weight (from 0% by weight to 30% by weight), and especially preferably not more than 10% by weight (from 0% by weight to 10% by weight).

The gel fraction of the film for semiconductor back surface 2 can be measured in the following measuring method. That is, about 0.1 g of a sample is sampled from the film for semiconductor back surface 2 and precisely weighed (weight of sample), and after the sample is wrapped in a mesh-type sheet, it is immersed in about 50 mL, of toluene at room temperature for 1 week. Thereafter, a solvent-insoluble matter (content in the mesh-type sheet) is taken out of the toluene and dried at 130° C. for about 2 hours, the solvent-insoluble matter after drying is weighed (weight after immersion and drying), and a gel fraction (% by weight) is then calculated according to the following expression (a).

$$\text{Gel fraction (\% by weight)} = [(\text{Weight after immersion and drying})/(\text{Weight of sample})] \times 100 \qquad (a)$$

The gel fraction of the film for semiconductor back surface 2 can be controlled by the kind and content of the resin components and the kind and content of the crosslinking agent and besides, heating temperature, heating time and the like.

The film for semiconductor back surface 2 is a film-shaped material, and when colored, its coloring form is not particularly limited. The film for semiconductor back surface 2 may be for example, a film-shaped material formed of a resin composition containing a thermoplastic resin component and/or a thermosetting resin component, a coloring agent and the like. The film for semiconductor back surface 2 may also be a film-shaped material having a configuration in which a resin layer formed of a resin composition containing a thermoplastic resin component and/or a thermosetting resin component and the like and a coloring agent layer are laminated.

In the case where the film for semiconductor back surface 2 is a laminate of a resin layer and a coloring agent layer, it is preferable that the film for semiconductor back surface 2 has a laminated form of (resin layer)/(coloring agent layer)/(resin layer). In this case, the two resin layers located on the both sides of the coloring agent layer may be a resin layer of the same composition or may be a resin layer having a different composition from each other.

In the invention, in the case where the film for semiconductor back surface 2 is a film-shaped material formed of a resin composition containing a thermosetting resin component such as an epoxy resin, close adhesion to the semiconductor wafer can be effectively exhibited.

In view of the fact that cutting water is used in the dicing step of a workpiece (semiconductor wafer), there may be the case where the film for semiconductor back surface 2 has a water content of an ordinary state or more upon absorption of moisture. When flip chip bonding is performed in such a high water content state as it is, there may be the case where water vapor remains at an adhesive (closely adhesive) interface between the film for semiconductor back surface 2 and the workpiece or a processed material thereof (for example, a chip-shaped workpiece), thereby causing lifting. Accordingly, when the film for flip chip type semiconductor back surface is configured to include, as an internal layer, a layer made of a core material with high moisture permeability, the water vapor is diffused, whereby such a problem can be avoided. From such a viewpoint, the film for semiconductor back surface 2 may have a multilayered structure in which a layer made of a resin composition for forming the film for semiconductor back surface 2 is formed on one face or both faces of a core material. Examples of the core material include films (for example, a polyimide film, a polyester film, a polyethylene terephthalate film, a polyethylene naphthalate film and a polycarbonate film), resin substrates reinforced with glass fibers or plastic-made nonwoven fibers, silicon substrates and glass substrates.

A thickness (total thickness in the case of a laminated film) of the film for semiconductor back surface 2 is not particularly limited, but it can be, for example, properly selected within the range of from about 5 μm to 500 μm. Furthermore, the thickness of the film for semiconductor back surface 2 is preferably from about 5 μm to 150 μm, and more preferably from about 5 μm to 100 μm. The film for semiconductor back surface 2 may be in any form of a single layer or a laminate.

As described previously, the film for semiconductor back surface 2 has a storage elastic modulus (at 60° C.) of from 0.9 MPa to 15 MPa and has favorable close adhesion (adhesiveness) to the semiconductor wafer. An adhesive force of the film for semiconductor back surface 2 to the semiconductor wafer is preferably 1 N/10 mm-width or more (for example, from 1 N/10 mm-width to 10 N/10 mm-width), more preferably 2 N/10 mm-width or more (for example, from 2 N/10 mm-width to 10 N/10 mm-width), and especially preferably 4 N/10 mm-width or more (for example, from 4 N/10 mm-width to 10 N/10 mm-width). When the adhesive force of the film for semiconductor back surface 2 to the semiconductor wafer is less than 1 N/10 mm-width, the dicing property is lowered.

The adhesive force of the film for semiconductor back surface 2 with respect to a semiconductor wafer is, for example, a value measured in the following manner. That is, a pressure-sensitive adhesive tape (a trade name: BT315, manufactured by Nitto Denko Corporation) is attached to one face of the film for semiconductor back surface 2, thereby reinforcing the back surface. Thereafter, a semiconductor wafer having a thickness of 0.6 mm is attached onto the surface of the back surface-reinforced film for semiconductor back surface 2 having a length of 150 mm and a width of 10 mm by reciprocating a roller of 2 kg at 50° C. once by a thermal laminating method. Thereafter, the laminate is allowed to stand on a hot plate (50° C.) for 2 minutes and then allowed to stand at ordinary temperature (about 23° C.) for 20 minutes. After standing, the back surface-reinforced film for semiconductor back surface 2 is peeled at a temperature of 23° C. under conditions of a peel angle of 180° and a tensile rate of 300 mm/min by using a peel tester (a trade name: AUTOGRAPH AGS-J, manufactured by Shimadzu Corporation). The adhesive force is a value (N/10 mm-width) measured by peeling at an interface between the film for semiconductor back surface 2 and the semiconductor wafer at this time.

An elastic modulus (tensile storage elastic modulus) at 23° C. of the film for semiconductor back surface 2 of the invention is preferably 1 GPa or more, more preferably 2 GPa or more, and especially preferably 3 GPa or more. When the tensile storage elastic modulus of the film for semiconductor back surface 2 is 1 GPa or more, at the time when a semiconductor element is peeled from the pressure-sensitive layer of the dicing tape together with the film for semiconductor back surface 2, and the film for semiconductor back surface 2 is then placed on the support (for example, a carrier tape) to perform transportation or the like, the attachment of the film for semiconductor back surface 2 to the support (for example, a top tape or a bottom tape in the carrier tape) can be effectively suppressed or prevented. In the case where the film for semiconductor back surface 2 is formed of a resin composition containing a thermosetting resin, as described previously, since the thermosetting resin is usually in an uncured or partially cured state, the tensile storage elastic modulus at 23° C. of the film for semiconductor back surface 2 is usually a value in a state in which the thermosetting resin is uncured or partially cured.

Here, though the film for semiconductor back surface 2 may be a single layer or may be a laminated film obtained by laminating plural layers, in the case of a laminated film, the tensile storage elastic modulus may be 1 GPa or more as a whole of the laminated film. Also, the foregoing tensile storage elastic modulus (at 23° C.) of the film for semiconductor back surface 2 in an uncured state can be controlled by suitably setting up the kind and content of the resin components (thermoplastic resin and/or thermosetting resin) or the kind and content of a filler such as a silica filler.

The elastic modulus (tensile storage elastic modulus) at 23° C. of the film for semiconductor back surface 2 is determined by preparing the film for semiconductor back surface 2 without being laminated on the dicing tape and measuring an elastic modulus in a tensile mode under conditions of a sample width of 10 mm, a sample length of 22.5 mm, a sample thickness of 0.2 mm, a frequency of 1 Hz and a temperature elevating rate of 10° C./min under a nitrogen atmosphere at a prescribed temperature (23° C.) using a dynamic viscoelasticity measuring apparatus "Solid Analyzer RS A2", manufactured by Rheometrics Co., Ltd. and is regarded as a value of obtained tensile storage elastic modulus.

A light transmittance (visible light transmittance) of the film for semiconductor back surface 2 in a visible light region (wavelength: from 400 nm to 800 nm) is not particularly restricted but is, for example, preferably in the range of not more than 20% (from 0% to 20%), more preferably in the range of not more than 10% (from 0% to 10%), and especially preferably in the range of not more than 5% (from 0% to 5%). When the light transmittance of the film for semiconductor back surface 2 in a visible light region is not more than 20%, the visible light transmits through the film for semiconductor back surface 2 and reaches a semiconductor chip, whereby adverse influences against the semiconductor chip can be diminished.

The visible light transmittance (%) of the film for semiconductor back surface 2 can be controlled by the kind and content of the resin components constituting the film for semiconductor back surface 2, the kind and content of a coloring agent (for example, a pigment and a dye), the kind and content of a filler and the like.

The visible light transmittance (%) can be, for example, calculated in the following manner. That is, the film for semiconductor back surface 2 having a thickness (average thickness) of 20 µm is prepared without being laminated on the dicing tape. Next, the film for semiconductor back surface 2 is irradiated with visible light using "ABSORPTION SPECTRO PHOTOMETER" (a trade name of Shimadzu Corporation). The visible light has a wavelength of from 400 nm to 800 nm. The light intensity of the visible light which has transmitted through the film for semiconductor back surface 2 by this irradiation can be calculated according to the following expression.

Visible light transmittance (%)=[(Light intensity of visible light after transmitting through the film for semiconductor back surface 2)/(Initial light intensity of visible light)]×100

The foregoing calculation method of the light transmittance (%) can also be applied to the calculation of a light transmittance (%) of a film for semiconductor back surface whose thickness is not 20 µm. Specifically, in accordance with the Lambert-Beer law, an absorbance $A_{20}$ in the case of the thickness of 20 µm can be calculated as follows.

$$A_{20} = \alpha \times L_{20} \times C \qquad (1)$$

(In the formula, $L_{20}$ is a length of light path, $\alpha$ is an absorbance index, C is a concentration of sample.)

In addition, an absorbance $A_X$ in the case of the thickness of X (µm) can be calculated as follows.

$$A_X = \alpha \times L_X \times C \qquad (2)$$

Moreover, absorbance $A_{20}$ in the case of the thickness of 20 µm can be calculated as follows.

$$A_{20} = -\log_{10} T_{20} \qquad (3)$$

(In the formula, $T_{20}$ is a light transmittance in the case of the thickness of 20 µm.)

From the formulae (1) to (3) above, absorbance $A_X$ can be represented by the following formula.

$$A_X = A_{20} \times (L_X/L_{20}) = -[\log_{10}(T_{20})] \times (L_X/L_{20})$$

Therefore, a light transmittance $T_X$ (%) in the case of the thickness of X µm can be calculated as follows:

$$T_X = 10^{-A_X}$$

wherein $A_X = -[\log_{10}(T_{20})] \times (L_X/L_{20})$.

Also, the fact that the thickness of the film for semiconductor back surface in the foregoing calculation method of a light transmittance (%) is regulated to 20 µm does not particularly restrict the thickness of the film for semiconductor back surface 2 of the invention. The value of "20 µm" is a thickness employed for the sake of convenience at the measurement.

Also, the film for semiconductor back surface 2 preferably has a low moisture absorbance. Specifically, the moisture absorbance is preferably not more than 1% by weight, and more preferably not more than 0.8% by weight. By regulating the moisture absorbance to not more than 1% by weight, the laser marking property can be enhanced. Also, for example, the generation of voids can be suppressed or prevented in a reflow step. The moisture absorbance can be, for example, regulated by changing an addition amount of an organic filler. The moisture absorbance is a value calculated from a weight change when the film is allowed to stand under an atmosphere at 85° C. and 85% RH for 168 hours (see the following expression). Also, in the case where the film for semiconductor back surface 2 is formed of a resin composition containing a thermosetting resin, the moisture absorbance is a value calculated from a weight change when the film is allowed to stand under an atmosphere at 85° C. and 85% RH for 168 hours after thermal curing.

Moisture absorbance (% by weight)=[{(Weight after allowing the colored film for semiconductor back surface to stand)−(Weight before allowing the colored film for semiconductor back surface to stand)}/(Weight before allowing the colored film for semiconductor back surface to stand)]×100

Furthermore, the film for semiconductor back surface 2 preferably has a small ratio of a volatile matter. Specifically, the ratio of a weight decrease (weight decrease ratio) after heating at a temperature of 250° C. for 1 hour is preferably not more than 1% by weight, and more preferably not more than 0.8% by weight. By regulating the weight decrease ratio to not more than 1% by weight, the laser marking property can be enhanced. Also, for example, the generation of cracks in a package can be suppressed or prevented in the reflow step. The weight decrease ratio can be, for example, regulated by adding an inorganic material capable of reducing the generation of cracks at the time of lead-free solder reflow. The weight decrease ratio is a value calculated from a weight change when the film is heated under a condition at 250° C. for 1 hour (see the following expression). Also, in the case where the film for semiconductor back surface 2 is formed of a resin composition containing a thermosetting resin, the weight decrease ratio is a value calculated from a weight change when the film is allowed to stand under a condition at 250° C. for 1 hour after thermal curing.

Weight decrease ratio (% by weight)=[{(Weight before allowing the colored film for semiconductor back surface to stand)−(Weight after allowing the colored film for semiconductor back surface to stand)}/(Weight before allowing the colored film for semiconductor back surface to stand)]× 100

The film for semiconductor back surface 2 (in particular, the wafer adhesion layer 22) is preferably protected by a separator (release liner) (not shown in Figures). The separator has a function as a protective material for protecting the film for semiconductor back surface 2 (in particular, the wafer adhesion layer 22) until it is put into practical use. Also, the separator can be further used as a supporting base material at transfer of the film for semiconductor back surface 2 to the pressure-sensitive adhesive layer 32 on the base material 31 of the dicing tape 3. The separator is peeled when a workpiece is attached onto the film for semiconductor back surface 2 of the dicing tape-integrated film for semiconductor back surface 1. As the separator, polyethylene or polypropylene, a plastic film (for example, polyethylene terephthalate) or paper whose surface is coated with a releasing agent such as a fluorine based releasing agent and a long chain alkyl acrylate based releasing agent can also be used. The separator can be formed by a conventionally known method. Also, a thickness or the like of the separator is not particularly restricted.

Dicing Tape

The dicing tape 3 is constituted by a base material 31 and a pressure-sensitive adhesive layer 32 formed on the base material 31. Thus, the dicing tape 3 sufficiently has a constitution that the base material 31 and the pressure-sensitive adhesive layer 32 are laminated. The base material 31 (supporting base material) can be used as a supporting material for the pressure-sensitive adhesive layer 32 and the like. As the base material 31, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [particularly, laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth)acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins. Moreover, as the material of the base material, a polymer such as a cross-linked body of each of the above resins can also be used. These raw materials may be employed singly or in a combination of two or more kinds.

In the case where a plastic base material 31 is used as the base material, deformation properties such as an elongation degree may be controlled by a stretching treatment or the like.

The thickness of the base material 31 is not particularly restricted and can be appropriately selected depending on strength, flexibility, intended purpose of use, and the like. For example, the thickness is generally 1000 μm or less (e.g., 1 to 1000 μm), preferably 1 to 500 μm, further preferably 3 to 300 μm, and especially about 5 to 250 μm but is not limited thereto. In this regard, the base material 31 may have any form of a single layer form and a laminated layer form.

A commonly used surface treatment, e.g., a chemical or physical treatment such as a chromate treatment, ozone exposure, flame exposure, exposure to high-voltage electric shock, or an ionized radiation treatment, or a coating treatment with an undercoating agent can be applied on the surface of the base material 31 in order to improve close adhesiveness with the adjacent layer, holding properties, etc.

Incidentally, the base material 31 may contain various additives (a coloring agent, a filler, a plasticizer, an antiaging agent, an antioxidant, a surfactant, a flame retardant, etc.) within the range where the advantages and the like of the invention are not impaired.

The pressure-sensitive adhesive layer 32 is formed of a pressure-sensitive adhesive and has pressure-sensitive adhesiveness. Such a pressure-sensitive adhesive is not particularly restricted and can be suitably selected among known pressure-sensitive adhesives. Specifically, as the pressure-sensitive adhesive, a pressure-sensitive adhesive having the above-mentioned characteristics can be suitably selected and used among known pressure-sensitive adhesives such as acrylic pressure-sensitive adhesives, rubber-based pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, fluorine-based pressure-sensitive adhesives, styrene-diene block copolymer-based pressure-sensitive adhesives, and creep characteristic-improving pressure-sensitive adhesives in which a heat-meltable resin having a melting point of about 200° C. or lower is mixed into these pressure-sensitive adhesives (see, e.g., JP-A-56-61468, JP-A-61-174857, JP-A-63-17981, JP-A-56-13040, etc., each of which herein incorporated by reference). Moreover, as the pressure-sensitive adhesives, radiation-curable pressure-sensitive adhesives (or energy ray-curable pressure-sensitive adhesives) or heat-expandable pressure-sensitive adhesives can be also used. The pressure-sensitive adhesive may be employed singly or in a combination of two or more kinds.

In the invention, as the pressure-sensitive adhesive, acrylic pressure-sensitive adhesives and rubber-based pressure-sensitive adhesives can be suitably used and particularly, acrylic pressure-sensitive adhesives are suitable. As the acrylic pressure-sensitive adhesives, there may be mentioned acrylic pressure-sensitive adhesives in which an acrylic polymer (homopolymer or copolymer) using one or more alkyl (meth) acrylates ((meth)acrylic acid alkyl ester) as monomer components is used as the base polymer.

Examples of the alkyl (meth)acrylates in the above-mentioned acrylic pressure-sensitive adhesives include alkyl (meth)acrylates such as methyl (meth)acrylate, ethyl (meth)

acrylate, propyl (meth)acrylate, isopropyl (meth)acrylate, butyl (meth)acrylate, isobutyl (meth)acrylate, s-butyl (meth) acrylate, t-butyl (meth)acrylate, pentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth) acrylate, pentadecyl (meth)acrylate, hexadecyl (meth) acrylate, heptadecyl (meth)acrylate, octadecyl (meth) acrylate, nonadecyl (meth)acrylate, and eicosyl (meth) acrylate. As the alkyl (meth)acrylates, alkyl (meth)acrylates having an alkyl group having 4 to 18 carbon atoms are suitable. Incidentally, the alkyl group of the alkyl (meth)acrylate may be linear or branched.

The above-mentioned acrylic polymer may contain units corresponding to other monomer components (copolymerizable monomer components) polymerizable with the above-mentioned alkyl (meth)acrylates for the purpose of modifying cohesive force, heat resistance, crosslinking ability, and the like. Examples of such copolymerizable monomer components include carboxyl group-containing monomers such as (meth)acrylic acid (acrylic acid or methacrylic acid), carboxyethyl acrylate, carboxypentyl acrylate, itaconic acid, maleic acid, fumaric acid, and crotonic acid; acid anhydride group-containing monomers such as maleic anhydride and itaconic anhydride; hydroxyl group-containing monomers such as hydroxyethyl (meth)acrylate, hydroxypropyl (meth) acrylate, hydroxybutyl (meth)acrylate, hydroxyhexyl (meth) acrylate, hydroxyoctyl (meth)acrylate, hydroxydecyl (meth) acrylate, hydroxylauryl (meth)acrylate, and (4-hydroxymethylcyclohexyl)methyl methacrylate; sulfonic acid group-containing monomers such as styrenesulfonic acid, allylsulfonic acid, 2-(meth)acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group-containing monomers such as 2-hydroxyethylacryloyl phosphate; (N-substituted)amide-based monomers such as (meth)acrylamide, N,N-dimethyl(meth)acrylamide, N-butyl(meth)acrylamide, N-methylol(meth)acrylamide, and N-methylolpropane (meth)acrylamide; aminoalkyl (meth)acrylate-based monomers such as aminoethyl (meth)acrylate, N,N-dimethylaminoethyl (meth)acrylate, and t-butylaminoethyl (meth) acrylate; alkoxyalkyl (meth)acrylate-based monomers such as methoxyethyl (meth)acrylate and ethoxyethyl (meth)acrylate; cyanoacrylate monomers such as acrylonitrile and methacrylonitrile; epoxy group-containing acrylic monomers such as glycidyl (meth)acrylate; styrene-based monomers such as styrene and α- methylstyrene; vinyl ester-based monomers such as vinyl acetate and vinyl propionate; olefin-based monomers such as isoprene, butadiene, and isobutylene; vinyl ether-based monomers such as vinyl ether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxylic acid amides, and N-vinylcaprolactam; maleimide-based monomers such as N-cyclohexylmaleimide, N-isopropylmaleimide, N-laurylmaleimide, and N-phenylmaleimide; itaconimide-based monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide-based monomers such as N-(meth)acryloyloxymethylenesuccinimide, N-(meth)acryloyl-6-oxyhexamethylenesuccinimide, and N-(meth)acryloyl-8-oxyoctamethylenesuccinimide; glycol-based acrylic ester monomers such as polyethylene glycol (meth)acrylate, polypropylene glycol (meth)acrylate, methoxyethylene glycol (meth)acrylate, and methoxypolypropylene glycol (meth) acrylate; acrylic acid ester-based monomers having a heterocycle, a halogen atom, a silicon atom, or the like, such as tetrahydrofurfuryl (meth)acrylate, fluorine (meth)acrylate, and silicone (meth)acrylate; polyfunctional monomers such as hexanediol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylolpropane tri(meth)acrylate, pentaerythritol tri(meth)acrylate, dipentaerythritol hexa(meth)acrylate, epoxy acrylate, polyester acrylate, urethane acrylate, divinylbenzene, butyl di(meth)acrylate, and hexyl di(meth)acrylate; and the like. These copolymerizable monomer components may be employed singly or in a combination of two or more kinds.

In the case that a radiation-curable pressure-sensitive adhesive (or an energy ray-curable pressure-sensitive adhesive) is used as a pressure-sensitive adhesive, examples of the radiation-curable pressure-sensitive adhesive (composition) include internal radiation-curable pressure-sensitive adhesives in which a polymer having a radically reactive carbon-carbon double bond in the polymer side chain or main chain is used as the base polymer, radiation-curable pressure-sensitive adhesives in which a LTV curable monomer component or oligomer component is blended into the pressure-sensitive adhesive, and the like. Moreover, in the case that the heat-expandable pressure-sensitive adhesive is used as the pressure-sensitive adhesive, there may be mentioned heat-expandable pressure-sensitive adhesives containing a pressure-sensitive adhesive and a foaming agent (particularly, heat-expandable microsphere) and the like as the heat-expandable pressure-sensitive adhesive.

In the invention, the pressure-sensitive adhesive layer 32 may contain various additives (e.g., a tackifying resin, a coloring agent, a thickener, an extender, a filler, a plasticizer, an antiaging agent, an antioxidant, a surfactant, a crosslinking agent, etc.) within the range where the advantages of the invention are not impaired.

The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned, and isocyanate-based crosslinking agents and epoxy-based crosslinking agents are suitable. The crosslinking agent may be employed singly or in a combination of two or more kinds. Incidentally, the amount of the crosslinking agent is not particularly restricted.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4-diphenylmethane diisocyanate, and xylylene diisocyanate. In addition, a trimethylolpropane/ tolylene diisocyanate trimer adduct [trade name "COLONATE L" manufactured by Nippon Polyurethane Industry Co., Ltd.], a trimethylolpropane/hexamethylene diisocyanate trimer adduct [trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

In the invention, instead of the use of the crosslinking agent or together with the use of the crosslinking agent, it is also possible to perform the crosslinking treatment by irradiation with an electron beam or ultraviolet light.

The pressure-sensitive adhesive layer 32 can be, for example, formed by utilizing a commonly used method including mixing a pressure-sensitive adhesive and optional solvent and other additives and then shaping the mixture into a sheet-like layer. Specifically, the pressure-sensitive adhesive layer 32 can be, for example, formed by a method including applying a mixture containing a pressure-sensitive adhesive and optional solvent and other additives on a base material 31, a method including applying the above-mentioned mixture on an appropriate separator (such as a release paper) to form a pressure-sensitive adhesive layer 32 and then transferring (transcribing) it on a base material 31, or the like method.

The thickness of the pressure-sensitive adhesive layer 32 is not particularly restricted and, for example, is about 5 to 300 μm, preferably 5 to 80 μm, and more preferably 15 to 50 μm. When the thickness of the pressure-sensitive adhesive layer 32 is within the above-mentioned range, an appropriate pressure-sensitive adhesive force can be effectively exhibited. The pressure-sensitive adhesive layer 32 may be either a single layer or a multi layer.

According to the invention, the dicing tape-integrated film for semiconductor back surface 1 can be made to have an antistatic function. Owing to this constitution, the circuit can be prevented from breaking down due to the generation of electrostatic energy at the time of close adhesion (adhesion) and at the time of peeling thereof or due to charging of a workpiece (such as semiconductor wafer) by the electrostatic energy. Imparting of the antistatic function can be performed by an appropriate manner such as a method of adding an antistatic agent or a conductive substance to the base material 31, the pressure-sensitive adhesive layer 32, and the film for semiconductor back surface 2 or a method of providing a conductive layer composed of a charge-transfer complex, a metal film, or the like onto the base material 31. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, a flake-shaped metal powder of silver, aluminum, gold, copper, nickel, a conductive alloy, or the like; a metal oxide such as alumina; amorphous carbon black, and graphite. However, the film for semiconductor back surface 2 is preferably non-conductive from the viewpoint of having no electric leakage.

Moreover, the dicing tape-integrated film for semiconductor back surface 1 may be formed in a form where it is wound as a roll or may be formed in a form where the sheet (film) is laminated. For example, in the case where the film has the form where it is wound as a roll, the film is wound as a roll in a state that the film for semiconductor back surface 2 is protected by a separator according to needs, whereby the film can be prepared as a dicing tape-integrated film for semiconductor back surface 1 in a state or form where it is wound as a roll. In this regard, the dicing tape-integrated film for semiconductor back surface 1 in the state or form where it is wound as a roll may be constituted by the base material 31, the pressure-sensitive adhesive layer 32 formed on one surface of the base material 31, the film for semiconductor back surface 2 formed on the pressure-sensitive adhesive layer 32, and a releasably treated layer (rear surface treated layer) formed on the other surface of the base material 31.

A thickness of the dicing tape-integrated film for semiconductor back surface 1 (a total thickness of the thickness of the film for semiconductor back surface 2 and the thickness of the dicing tape 3 composed of the base material 31 and the pressure-sensitive adhesive layer 32) can be, for example, selected within the range of from 11 μm to 300 μm, and it is preferably from 11 μm to 200 μm, more preferably from 15 μm to 200 μm, and further preferably from 15 μm to 100 μm (especially preferably from 20 μm to 80 μm).

In the dicing tape-integrated film for semiconductor back surface 1, a ratio of the thickness of the film for semiconductor back surface 2 to the thickness of the pressure-sensitive adhesive layer 32 in the dicing tape 3 is not particularly restricted, but it can be, for example, properly selected within the range of from 150/5 to 3/100 in terms of a ratio of {(thickness of the film for semiconductor back surface 2)/(thickness of the pressure-sensitive adhesive layer 32 in the dicing tape 3)}. The ratio of the thickness of the film for semiconductor back surface 2 to the thickness of the pressure-sensitive adhesive layer 32 in the dicing tape 3 is preferably from 100/5 to 3/50, and more preferably 60/5 to 3/40. When the ratio of the thickness of the film for semiconductor back surface 2 to the thickness of the pressure-sensitive adhesive layer 32 in the dicing tape 3 falls within the foregoing range, an appropriate pressure-sensitive adhesive force can be exhibited, and excellent dicing property and picking-up property can be exhibited.

In the dicing tape-integrated film for semiconductor back surface 1, a ratio of the thickness of the film for semiconductor back surface 2 to the thickness of the dicing tape 3 is not particularly restricted, but it can be, for example, properly selected within the range of from 150/50 to 3/500 in terms of a ratio of {(thickness of the film for semiconductor back surface 2)/(thickness of the dicing tape 3)}. The ratio of the thickness of the film for semiconductor back surface 2 to the thickness of the dicing tape 3 is preferably from 100/50 to 3/300, and more preferably from 60/50 to 3/150. By regulating the ratio of the thickness of the film for semiconductor back surface 2 to the thickness of the dicing tape 3 to not more than 3/500, a lowering in the picking-up property can be suppressed. On the other hand, by regulating the ratio of the thickness of the film for semiconductor back surface 2 to the thickness of the dicing tape 3 to 150/50 or more, the generation of a lateral residue at dicing or an increase of its amount can be suppressed.

As above, in the dicing tape-integrated film for semiconductor back surface 1, by regulating the ratio of the thickness of the film for semiconductor back surface 2 to the thickness of the pressure-sensitive adhesive layer 32 in the dicing tape 3 or the ratio of the thickness of the film for semiconductor back surface 2 to the thickness of the dicing tape 3, a dicing property at the dicing step and a picking-up property at the picking-up step can be enhanced. Also, the dicing tape-integrated film for semiconductor back surface 1 can be effectively utilized from the dicing step of a workpiece such as a semiconductor wafer to the flip chip connection step of a semiconductor element such as a semiconductor chip.

Producing Method of Dicing Tape-Integrated Film for Semiconductor Back Surface

The producing method of the dicing tape-integrated film for semiconductor back surface of the invention is described while using the dicing tape-integrated film for semiconductor back surface 1 as an example. First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, the pressure-sensitive adhesive layer 32 is formed by applying a pressure-sensitive adhesive composition onto the base material 31, followed by drying (by crosslinking under heating according to needs). Examples of the application method include roll coating, screen coating, and gravure coating. In this regard, the application of the pressure-sensitive adhesive composition may be performed directly onto the base material 31 to form the pressure-sensitive adhesive layer 32 on the base material 31, or the pressure-sensitive adhesive composition may be applied onto a release paper or the like whose surface has been subjected to a releasable treatment to form a pressure-sensitive adhesive layer 32, which is then transferred onto the base material 31 to form the pressure-sensitive adhesive layer 32 on the base material 31. Thus, a dicing tape 3 is prepared by forming the pressure-sensitive adhesive layer 32 on the base material 31.

On the other hand, a coating layer is formed by coating a forming material for forming the film for flip chip type semiconductor back surface 2 on a release paper so as to have a prescribed thickness after drying and further drying it under prescribed conditions (in the case where thermal curing is required or the like, performing a heating treatment to achieve drying, if desired). This coating layer is transferred onto the pressure-sensitive adhesive layer 32, thereby forming the film for flip chip type semiconductor back surface 2 on the pressure-sensitive adhesive layer 32. In this regard, the film for flip chip type semiconductor back surface 2 can also be formed on the pressure-sensitive adhesive layer 32 by coating a forming material for forming the film for flip chip type semiconductor back surface 2 directly on the pressure-sensitive adhesive layer 32 and then drying it under prescribed conditions (in the case where thermal curing is required or the like, performing a heating treatment to achieve drying, if desired). There can be thus obtained the dicing tape-integrated film for semiconductor back surface 1 according to the invention. In the case where thermal curing is performed at the formation of the film for semiconductor back surface 2, it is important to perform thermal curing to an extent that this is in a partially cured state. However, it is preferable that the thermal curing is not performed.

The dicing tape-integrated film for semiconductor back surface 1 can be suitably used at the production of a semiconductor device including a flip chip bonding step. Namely, the dicing tape-integrated film for semiconductor back surface 1 is used at the production of a flip chip-mounted semiconductor device and thus the flip chip-mounted semiconductor device is produced in a condition or form where the film for semiconductor back surface 2 is attached to the back surface of the semiconductor chip. Therefore, the dicing tape-integrated film for semiconductor back surface 1 according to the invention can be used for a flip chip-mounted semiconductor device (a semiconductor device in a state or form where the semiconductor chip is fixed to an adherend such as a substrate by a flip chip bonding method).

Semiconductor Wafer

The workpiece is not particularly restricted as long as it is a known or commonly used semiconductor wafer and can be appropriately selected and used among semiconductor wafers made of various materials. In the invention, as the semiconductor wafer, a silicon wafer can be suitable used.

Production Process of Semiconductor Device

The process for producing a semiconductor device of the invention is not particularly restricted as long as it is a process for producing a semiconductor device using the above-mentioned dicing tape-integrated film for semiconductor back surface. For example, a production process including the following steps and the like process may be mentioned:

a step (mounting step) of attaching a workpiece onto the film for flip chip type semiconductor back surface of the dicing tape-integrated film for semiconductor back surface;

a step (dicing step) of dicing the workpiece to form a semiconductor element;

a step (picking-up step) of peeling the semiconductor element from the pressure-sensitive adhesive layer of the dicing tape together with the film for flip chip type semiconductor back surface; and a step (flip chip bonding step) of fixing the semiconductor element to an adherend by flip chip bonding.

More specifically, as the process for producing a semiconductor device, for example, a semiconductor device can be produced using the dicing tape-integrated film for semiconductor back surface of the invention, after the separator optionally provided on the film for semiconductor back surface is appropriately peeled off, as follows. Hereinafter, referring to FIGS. 2A to 2D, the process is described while using the dicing tape-integrated film for semiconductor back surface 1 as an example.

FIGS. 2A to 2D are cross-sectional schematic views showing one embodiment of the process for producing a semiconductor device using the dicing tape-integrated film for semiconductor back surface of the invention. In FIGS. 2A to 2D, 4 is a workpiece (semiconductor wafer), 5 is a semiconductor element (semiconductor chip), 51 is a bump formed at the circuit face of the semiconductor chip 5, 6 is an adherend, 61 is a conductive material for conjugation adhered to a connecting pad of the adherend 6, and 1, 2, 3, 31, and 32 are respectively a dicing tape-integrated film for semiconductor back surface, a film for flip chip type semiconductor back surface, a dicing tape, a base material, and a pressure-sensitive adhesive layer, as mentioned above.

(Mounting Step)

Figure 2A:
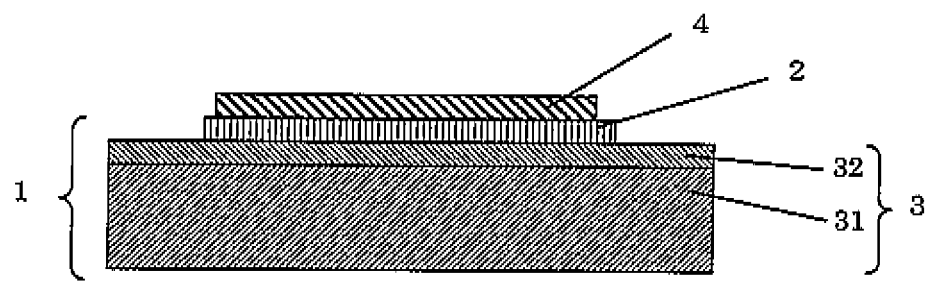
FIGS. 2A to 2D are cross-sectional schematic views showing one embodiment of a process for producing a semiconductor device using a dicing tape-integrated film for semiconductor back surface of the invention.

First, as shown in FIG. 2A, the semiconductor wafer (workpiece) 4 is attached (especially press-bonded) onto the wafer adhesion layer 22 of the film for flip chip type semiconductor back surface 2 in the dicing tape-integrated film for semiconductor back surface 1 to fix the semiconductor wafer by close adhesion (adhesion) and holding (mounting step). The present step is usually performed while pressing with a pressing means such as a pressing roll, (Dicing Step)

Figure 2B:
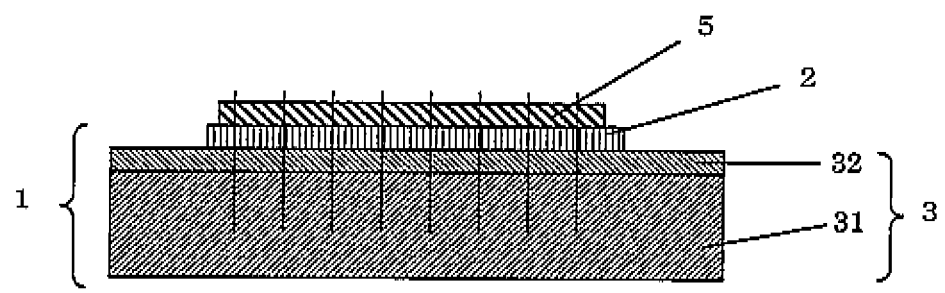

Next, as shown in FIG. 2B, the semiconductor wafer 4 is diced. Consequently, the semiconductor wafer 4 is cut into a prescribed size and individualized (is formed into small pieces) to produce semiconductor elements (semiconductor chips) 5. The dicing is performed according to a normal method from the circuit face side of the semiconductor wafer 4, for example. Moreover, the present step can adopt, for example, a cutting method called full-cut that forms a slit reaching the dicing tape-integrated film for semiconductor back surface 1. The dicing apparatus used in the present step is not particularly restricted, and a conventionally known apparatus can be used. Further, since the semiconductor wafer 4 is close-adhered (adhered) and fixed by the dicing tape-integrated film for semiconductor back surface 1 having the film for semiconductor back surface 2 having a storage elastic modulus (at 60° C.) of from 0.9 MPa to 15 MPa with an excellent close adhesiveness, chip crack and chip fly can be suppressed, as well as the damage of the semiconductor wafer 4 can also be suppressed. In this regard, when the film for flip chip type semiconductor back surface 2 is formed of a resin composition containing an epoxy resin, generation of adhesive extrusion from the film for semiconductor back surface 2 is suppressed or prevented at the cut surface even when it is cut by dicing. As a result, re-attachment (blocking) of the cut surfaces themselves can be suppressed or prevented and thus the picking-up to be mentioned below can be furthermore conveniently performed.

In the case where the dicing tape-integrated film for semiconductor back surface 1 is expanded, the expansion can be performed using a conventionally known expanding apparatus. The expanding apparatus has a doughnut-shaped outer ring capable of pushing the dicing tape-integrated film for semiconductor back surface downward through a dicing ring and an inner ring which has a diameter smaller than the outer ring and supports the dicing tape-integrated film for semiconductor back surface 1. Owing to the expanding step, it is possible to prevent the damage of adjacent semiconductor chips through contact with each other in the picking-up step to be mentioned below.

(Picking-up Step)

Figure 2C:
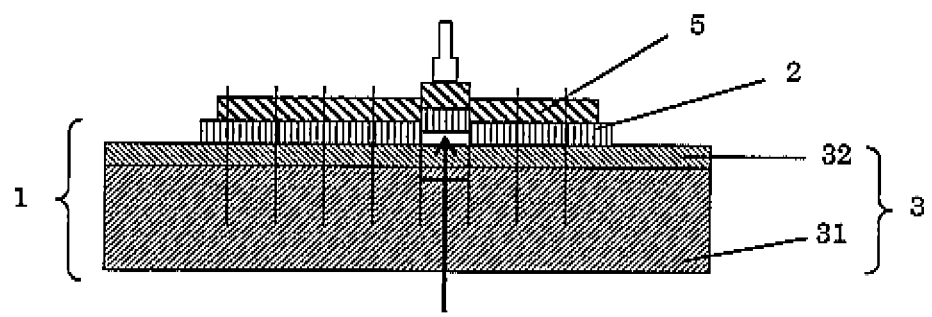
Figure 2D:
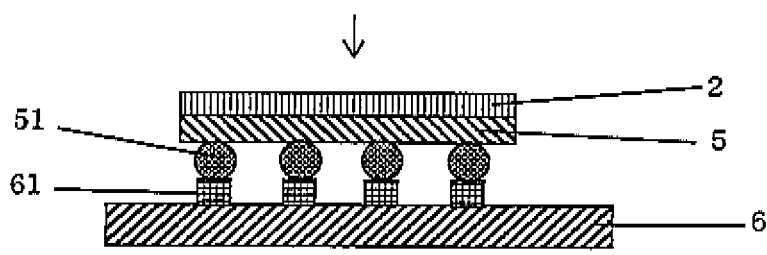

Picking-up of the semiconductor chip 5 is performed as shown in FIG. 2C to peel the semiconductor chip 5 together with the film for semiconductor back surface 2 from the dicing tape 3 in order to collect the semiconductor chip 5 that is close-adhered (adhered) and fixed to the dicing tape-integrated film for semiconductor back surface 1. The method of picking-up is not particularly restricted, and conventionally known various methods can be adopted. For example, there may be mentioned a method including pushing up each semiconductor chip 5 from the base material 31 side of the dicing tape-integrated film for semiconductor back surface 1 with a needle and picking-up the pushed semiconductor chip 5 with a picking-up apparatus. In this regard, the back surface (also referred to as a non-circuit face, a non-electrode-formed face, etc.) of the picked-up semiconductor chip 5 is protected with the film for flip chip type semiconductor back surface 2.

In the invention, since the storage elastic modulus (at 60° C.) of the film for semiconductor back surface 2 is from 0.9 MPa to 15 MPa, the semiconductor chip 5 can be easily peeled from the dicing tape 3 together with the film for semiconductor back surface 2, and picking-up of the semiconductor chip 5 can be performed with an excellent picking-up property.

(Flip Chip Bonding Step)

The picked-up semiconductor chip 5 is fixed to an adherend such as a base material by a flip chip bonding method (flip chip mounting method). Specifically, the semiconductor chip 5 is fixed to the adherend 6 according to a usual manner in a form where the circuit face (also referred to as a front face, circuit pattern-formed face, electrode-formed face, etc.) of the semiconductor chip 5 is opposed to the adherend 6. For example, the bump 51 formed at the circuit face of the semiconductor chip 5 is brought into contact with a conductive material 61 (such as solder) attached to a connecting pad of the adherend 6 and the conductive material is melted under pressing, whereby electric connection between the semiconductor chip 5 and the adherend 6 can be secured and the semiconductor chip 5 can be fixed to the adherend 6. In this regard, at the fixing of the semiconductor chip 5 to the adherend 6, it is important that the opposing faces of the semiconductor chip 5 and the adherend 6 and the gap are washed in advance and an encapsulating material (such as an encapsulating resin) is then filled into the gap.

As the adherend 6, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding, the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the present step, the conductive material is melted to connect the bump at the circuit face of the semiconductor chip 5 and the conductive material on the surface of the adherend 6. The temperature at the melting of the conductive material is usually about 260° C. (e.g., 250° C. to 300° C.). The dicing tape-integrated film for semiconductor back surface 1 of the invention can be made to have thermal resistance capable of enduring the high temperature in the flip chip bonding step by forming the film for semiconductor back surface 2 with an epoxy resin or the like.

Moreover, the washing liquid to be used at washing the opposing face (electrode-formed face) between the semiconductor chip 5 and the adherend 6 in the flip chip bonding and the gap is not particularly restricted and the liquid may be an organic washing liquid or may be an aqueous washing liquid. The film for semiconductor back surface 2 in the dicing tape-integrated film for semiconductor back surface 1 of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

In the invention, the encapsulating material to be used at the encapsulation of the gap between the semiconductor chip 5 and the adherend 6 is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin in addition to the epoxy resin. Incidentally, a phenol resin can be utilized as a curing agent for the epoxy resin and, as such a phenol resin, there may be mentioned phenol resins exemplified in the above.

In the encapsulation step with the encapsulating resin, the encapsulating resin is usually cured by heating to achieve encapsulation. The curing of the encapsulating resin is usually carried out at 175° C. for 60 seconds to 90 seconds in many cases. However, in the invention, without limitation thereto, the curing may be performed at a temperature of 165 to 185° C. for several minutes, for example. In this regard, in case that the film for semiconductor back surface 2 is formed of a resin composition containing a thermoplastic resin component and a thermosetting resin component, the thermosetting resin component can be completely or almost completely cured at the curing of this encapsulating resin.

The distance of the gap between the semiconductor chip 5 and the adherend 6 is generally about 30 µm to 300 µm.

The thus formed semiconductor device can be suitably used as electronic parts or materials thereof.

In the semiconductor device (flip chip-mounted semiconductor device) manufactured using the dicing tape-integrated film for semiconductor back surface 1 of the invention, the film for semiconductor back surface 2 is attached to the back surface of the semiconductor element, and therefore, various making can be applied with excellent visibility. In particular, even when the marking method is a laser marking method, marking can be applied with an excellent contrast ratio, and it is possible to observe various kinds of information (for example, literal information and graphical information) applied by laser marking with good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc) are suitable. As the solid-state laser, any known solid-state lasers can be utilized without particular limitation but a YAG laser (such as Nd:YAG laser) and a $YVO_4$ laser are suitable.

Since the semiconductor device produced using the dicing tape-integrated film for semiconductor back surface of the invention is a semiconductor device mounted by the flip chip mounting method, the device has a thinned and miniaturized shape as compared with a semiconductor device mounted by a die-bonding mounting method. Thus, the flip chip mounted semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

EXAMPLES

The following will illustratively describe preferred Examples of the invention in detail. However, the materials, the mixing amount, and the like described in these Examples are not intended to limit the scope of the invention to only those unless otherwise stated, and they are merely explanatory examples. Moreover, part in each example is a weight standard unless otherwise stated.

Example 1

<Preparation of Colored Film for Semiconductor Back Surface>

12 parts of an epoxy resin (a trade name: EPIKOTE 1004, manufactured by JER Co., Ltd.), 13 parts of a phenol resin (a trade name: MIREX XLC-4L, manufactured by Mitsui Chemicals, Inc.), 246 parts of spherical silica (a trade name: SO-25R, manufactured by Admatechs Company Limited), 5 parts of Dye 1 (a trade name: OIL GREEN 502, manufactured by Orient Chemical Industries Co., Ltd.) and 5 parts of Dye 2 (a trade name: OIL BLACK BS, manufactured by Orient Chemical Industries Co., Ltd.) based on 100 parts of an acrylic acid ester based polymer (a trade name: PARACRON W-197CM, manufactured by Negami Chemical Industrial Co., Ltd.) having ethyl acrylate and methyl methacrylate as main components were dissolved in methyl ethyl ketone to prepare a solution of a resin composition having a solid concentration of 23.6% by weight.

This resin composition solution was coated on, as a release liner (separator), a releasably treated film constituted of a polyethylene terephthalate film having a thickness of 50 µm, which had been subjected to a silicone-releasing treatment, and then dried at 130° C. for 2 minutes to prepare a colored film for semiconductor back surface A having an average thickness of 20 µm.

<Preparation of Dicing Tape-Integrated Film for Semiconductor Back Surface>

The foregoing colored film for semiconductor back surface A was attached onto a pressure-sensitive adhesive layer of a dicing tape (a trade name: V-8-T, manufactured by Nitto Denko Corporation; average thickness of base material: 65 µm, average thickness of pressure-sensitive adhesive layer: 10 µm) by using a hand roller, thereby preparing a dicing tape-integrated film for semiconductor back surface.

In the dicing tape-integrated film for semiconductor back surface according to this Example 1, a thickness (average thickness) of the colored film for semiconductor back surface was 20 µm. Also, in the dicing tape (a trade name: V-8-T, manufactured by Nitto Denko Corporation), an average thickness of the base material was 65 µm; an average thickness of the pressure-sensitive adhesive layer was 10 µm; and a total thickness was 75 µm. Accordingly, a ratio of the thickness of the colored film for semiconductor back surface to the thickness of the pressure-sensitive adhesive layer (ratio in average thickness) was 20/10; and a ratio of the thickness of the colored film for semiconductor back surface to the thickness of the dicing tape (ratio in average thickness) was 20/75.

Example 2

<Preparation of Colored Film for Semiconductor Back Surface>

12 parts of an epoxy resin (a trade name: EPIKOTE 1004, manufactured by JER Co., Ltd.), 13 parts of a phenol resin (a trade name: MIREX XLC-4L, manufactured by Mitsui Chemicals, Inc.), 246 parts of spherical silica (a trade name: SO-25R, manufactured by Admatechs Company Limited), 10 parts of Dye 1 (a trade name: OIL GREEN 502, manufactured by Orient Chemical Industries Co., Ltd.) and 10 parts of Dye 2 (a trade name: OIL BLACK BS, manufactured by Orient Chemical Industries Co., Ltd.) based on 100 parts of an acrylic acid ester based polymer (a trade name: PARACRON W-197CM, manufactured by Negami Chemical. Industrial Co., Ltd.) having ethyl acrylate and methyl methacrylate as main components were dissolved in methyl ethyl ketone to prepare a solution of a resin composition having a solid concentration of 23.6% by weight.

This resin composition solution was coated on, as a release liner (separator), a releasably treated film constituted of a polyethylene terephthalate film having a thickness of 50 μm, which had been subjected to a silicone-releasing treatment, and then dried at 130° C. for 2 minutes to prepare a colored film for semiconductor back surface B having an average thickness of 20 μm.

<Preparation of Dicing Tape-Integrated Film for Semiconductor Back Surface>

The foregoing colored film for semiconductor back surface B was attached onto a pressure-sensitive adhesive layer of a dicing tape (a trade name: V-8-T, manufactured by Nitto Denko Corporation; average thickness of base material: 65 μm, average thickness of pressure-sensitive adhesive layer: 10 μm) by using a hand roller, thereby preparing a dicing tape-integrated film for semiconductor back surface.

In the dicing tape-integrated film for semiconductor back surface according to this Example 2, a thickness (average thickness) of the colored film for semiconductor back surface was 20 μm. Also, in the dicing tape (a trade name: V-8-T, manufactured by Nitto Denko Corporation), an average thickness of the base material was 65 μm; an average thickness of the pressure-sensitive adhesive layer was 10 μm; and a total thickness was 75 μm. Accordingly, a ratio of the thickness of the colored film for semiconductor back surface to the thickness of the pressure-sensitive adhesive layer (ratio in average thickness) was 20/10; and a ratio of the thickness of the colored film for semiconductor back surface to the thickness of the dicing tape (ratio in average thickness) was 20/75.

Example 3

<Preparation of Colored Film for Semiconductor Back Surface>

32 parts of an epoxy resin (a trade name: EPIKOTE 1004, manufactured by JER Co., Ltd.), 35 parts of a phenol resin (a trade name: MIREX XLC-4L, manufactured by Mitsui Chemicals, Inc.), 90 parts of spherical silica (a trade name: SO-25R, manufactured by Admatechs Company Limited), 3 parts of Dye 1 (a trade name: OIL GREEN 502, manufactured by Orient Chemical Industries Co., Ltd.) and 3 parts of Dye 2 (a trade name: OIL BLACK BS, manufactured by Orient Chemical Industries Co., Ltd.) based on 100 parts of an acrylic acid ester based polymer (a trade name: PARACRON W-197CM, manufactured by Negami Chemical Industrial Co., Ltd.) having ethyl acrylate and methyl methacrylate as main components were dissolved in methyl ethyl ketone to prepare a solution of a resin composition having a solid concentration of 23.6% by weight.

This resin composition solution was coated on, as a release liner (separator), a releasably treated film constituted of a polyethylene terephthalate film having a thickness of 50 μm, which had been subjected to a silicone-releasing treatment, and then dried at 130° C. for 2 minutes to prepare a colored film for semiconductor back surface C having an average thickness of 20 μm.

<Preparation of Dicing Tape-Integrated Film for Semiconductor Back Surface>

The foregoing colored film for semiconductor back surface C was attached onto a pressure-sensitive adhesive layer of a dicing tape (a trade name: V-8-T, manufactured by Nitta Denko Corporation; average thickness of base material: 65 μm, average thickness of pressure-sensitive adhesive layer: 10 μm) by using a hand roller, thereby preparing a dicing tape-integrated film for semiconductor back surface.

In the dicing tape-integrated film for semiconductor back surface according to this Example 3, a thickness (average thickness) of the colored film for semiconductor back surface was 20 μm. Also, in the dicing tape (a trade name: V-8-T, manufactured by Nitto Denko Corporation), an average thickness of the base material was 65 μm; an average thickness of the pressure-sensitive adhesive layer was 10 μm; and a total thickness was 75 μm. Accordingly, a ratio of the thickness of the colored film for semiconductor back surface to the thickness of the pressure-sensitive adhesive layer (ratio in average thickness) was 20/10; and a ratio of the thickness of the colored film for semiconductor back surface to the thickness of the dicing tape (ratio in average thickness) was 20/75.

Example 4

<Preparation of Colored Film for Semiconductor Back Surface>

113 parts of an epoxy resin (a trade name: EPIKOTE 1004, manufactured by JER Co., Ltd.), 121 parts of a phenol resin (a trade name: MIREX XLC-4L, manufactured by Mitsui Chemicals, Inc.), 223 parts of spherical silica (a trade name: SO-25R, manufactured by Admatechs Company Limited), 5 parts of Dye 1 (a trade name: OIL GREEN 502, manufactured by Orient Chemical Industries Co., Ltd.) and 5 parts of Dye 2 (a trade name: OIL BLACK BS, manufactured by Orient Chemical Industries Co., Ltd.) based on 100 parts of an acrylic acid ester based polymer (a trade name: PARACRON W-197CM, manufactured by Negami Chemical Industrial Co., Ltd.) having ethyl acrylate and methyl methacrylate as main components were dissolved in methyl ethyl ketone to prepare a solution of a resin composition having a solid concentration of 23.6% by weight.

This resin composition solution was coated on, as a release liner (separator), a releasably treated film constituted of a polyethylene terephthalate film having a thickness of 50 μm, which had been subjected to a silicone-releasing treatment, and then dried at 130° C. for 2 minutes to prepare a colored film for semiconductor back surface D having an average thickness of 20 μm.

<Preparation of Dicing Tape-Integrated Film for Semiconductor Back Surface>

The foregoing colored film for semiconductor back surface D was attached onto a pressure-sensitive adhesive layer of a dicing tape (a trade name: V-8-T, manufactured by Nitto Denko Corporation; average thickness of base material: 65 μm, average thickness of pressure-sensitive adhesive layer: 10 μm) by using a hand roller, thereby preparing a dicing tape-integrated film for semiconductor back surface.

In the dicing tape-integrated film for semiconductor back surface according to this Example 4, a thickness (average thickness) of the colored film for semiconductor back surface was 20 μm. Also, in the dicing tape (a trade name: V-8-T, manufactured by Nitto Denko Corporation), an average thickness of the base material was 65 μm; an average thickness of the pressure-sensitive adhesive layer was 10 μm; and a total thickness was 75 μm. Accordingly, a ratio of the thickness of the colored film for semiconductor back surface to the thickness of the pressure-sensitive adhesive layer (ratio in average thickness) was 20/10; and a ratio of the thickness of the colored film for semiconductor back surface to the thickness of the dicing tape (ratio in average thickness) was 20/75.

Comparative Example 1

<Preparation of Colored Film for Semiconductor Back Surface>

113 parts of an epoxy resin (a trade name: EPIKOTE 1004, manufactured by JER Co., Ltd.), 121 parts of a phenol resin (a trade name: MIREX XLC-4L, manufactured by Mitsui Chemicals, Inc.), 3,006 parts of spherical silica (a trade name: SO-25R, manufactured by Admatechs Company Limited), 5 parts of Dye 1 (a trade name: OIL GREEN 502, manufactured by Orient Chemical Industries Co., Ltd.) and 5 parts of Dye 2 (a trade name: OIL BLACK BS, manufactured by Orient Chemical Industries Co., Ltd.) based on 100 parts of an acrylic acid ester based polymer (a trade name: PARACRON W-197CM, manufactured by Negami Chemical Industrial Co., Ltd.) having ethyl acrylate and methyl methacrylate as main components were dissolved in methyl ethyl ketone to prepare a solution of a resin composition having a solid concentration of 23.6% by weight.

This resin composition solution was coated on, as a release liner (separator), a releasably treated film constituted of a polyethylene terephthalate film having a thickness of 50 μm, which had been subjected to a silicone-releasing treatment, and then dried at 130° C. for 2 minutes to prepare a colored film for semiconductor back surface E having an average thickness of 20 μm.

<Preparation of Dicing Tape-Integrated Film for Semiconductor Back Surface>

The foregoing colored film for semiconductor back surface E was attached onto a pressure-sensitive adhesive layer of a dicing tape (a trade name: V-8-T, manufactured by Nitto Denko Corporation; average thickness of base material: 65 μm, average thickness of pressure-sensitive adhesive layer: 10 μm) by using a hand roller, thereby preparing a dicing tape-integrated film for semiconductor back surface.

In the dicing tape-integrated film for semiconductor back surface according to this Comparative Example 1, a thickness (average thickness) of the colored film for semiconductor back surface was 20 μm. Also, in the dicing tape (a trade name: V-8-T, manufactured by Nitto Denko Corporation), an average thickness of the base material was 65 μm; an average thickness of the pressure-sensitive adhesive layer was 10 μm; and a total thickness was 75 μm. Accordingly, a ratio of the thickness of the colored film for semiconductor back surface to the thickness of the pressure-sensitive adhesive layer (ratio in average thickness) was 20/10; and a ratio of the thickness of the colored film for semiconductor back surface to the thickness of the dicing tape (ratio in average thickness) was 20/75.

Comparative Example 2

<Preparation of Colored Film for Semiconductor Back Surface>

273 parts of an epoxy resin (a trade name: EPIKOTE 828, manufactured by JER Co., Ltd.), 293 parts of a phenol resin (a trade name: MIREX XLC-4L, manufactured by Mitsui Chemicals, Inc.), 246 parts of spherical silica (a trade name: SO-25R, manufactured by Admatechs Company Limited), 5 parts of Dye 1 (a trade name: OIL GREEN 502, manufactured by Orient Chemical Industries Co., Ltd.) and 5 parts of Dye 2 (a trade name: OIL BLACK BS, manufactured by Orient Chemical Industries Co., Ltd.) based on 100 parts of an acrylic acid ester based polymer (a trade name: PARACRON W-197CM, manufactured by Negami Chemical Industrial Co., Ltd.) having ethyl acrylate and methyl methacrylate as main components were dissolved in methyl ethyl ketone to prepare a solution of a resin composition having a solid concentration of 23.6% by weight.

This resin composition solution was coated on, as a release liner (separator), a releasably treated film constituted of a polyethylene terephthalate film having a thickness of 50 μm, which had been subjected to a silicone-releasing treatment, and then dried at 130° C. for 2 minutes to prepare a colored film for semiconductor back surface F having an average thickness of 20 μm.

<Preparation of Dicing Tape-Integrated Film for Semiconductor Back Surface>

The foregoing colored film for semiconductor back surface F was attached onto a pressure-sensitive adhesive layer of a dicing tape (a trade name: V-8-T, manufactured by Nitto Denko Corporation; average thickness of base material: 65 μm, average thickness of pressure-sensitive adhesive layer: 10 μm) by using a hand roller, thereby preparing a dicing tape-integrated film for semiconductor back surface.

In the dicing tape-integrated film for semiconductor back surface according to this Comparative Example 2, a thickness (average thickness) of the colored film for semiconductor back surface was 20 μm. Also, in the dicing tape (a trade name: V-8-T, manufactured by Nitto Denko Corporation), an average thickness of the base material was 65 μm; an average thickness of the pressure-sensitive adhesive layer is 10 μm; and a total thickness is 75 μm. Accordingly, a ratio of the thickness of the colored film for semiconductor back surface to the thickness of the pressure-sensitive adhesive layer (ratio in average thickness) was 20/10; and a ratio of the thickness of the colored film for semiconductor back surface to the thickness of the dicing tape (ratio in average thickness) was 20/75.

(Measurement of Physical Properties of Colored Film for Semiconductor Back Surface)

With respect to each of the colored film for semiconductor back surfaces in the dicing tape-integrated film for semiconductor back surfaces prepared in Examples 1 to 4 and Comparative Examples 1 to 2, a visible light transmittance (%), a moisture absorbance (% by weight) and a weight decrease ratio (% by weight) were measured, respectively in the following manners. The results of the measurement are shown in the following Table 1.

<Measuring Method of Visible Light Transmittance>

Each of the colored film for semiconductor back surfaces A to F prepared in Examples 1 to 4 and Comparative Examples 1 to 2 (average thickness: 20 μm) was irradiated with visible light using "ABSORPTION SPECTRO PHOTOMETER" (a trade name, manufactured by Shimadzu Corporation). A wavelength of the visible light was regulated to from 400 nm to 800 μm. A light intensity of the visible light which had transmitted through the colored film for semiconductor back surface 2 by this irradiation was measured and calculated according to the following expression, Visible light transmittance (%)=[(Light intensity of visible light after transmitting through the colored film for semiconductor back surface)/(Initial light intensity of visible light)]×100

<Measuring Method of Moisture Absorbance>

Each of the colored film for semiconductor back surfaces A to F prepared in Examples 1 to 4 and Comparative Examples 1 to 2 was allowed to stand in a constant-temperature and constant-humidity chamber at a temperature of 85° C. and a humidity of 85% RH for 168 hours. A weight before and after standing was measured, and a moisture absorbance (% by weight) was calculated according to the following expression.

Moisture absorbance (% by weight)=[{(Weight after allowing the colored film for semiconductor back surface to stand)−(Weight before allowing the colored film for semiconductor back surface to stand)}/(Weight before allowing the colored film for semiconductor back surface to stand)]×100

<Measuring Method of Weight Decrease Ratio>

Each of the colored film for semiconductor back surfaces A to F prepared in Examples 1 to 4 and Comparative Examples 1 to 2 was allowed to stand in a drying machine at a temperature of 250° C. for 1 hour. A weight before and after standing was measured, and a weight decrease ratio (% by weight) was calculated according to the following expression.

Weight decrease ratio (% by weight)=[{(Weight before allowing the colored film for semiconductor back surface to stand)−(Weight after allowing the colored film for semiconductor back surface to stand)}/(Weight before allowing the colored film for semiconductor back surface to stand)]×100 the following evaluating or measuring methods. The results of the evaluation or measurement are shown in Table 2.

<Measuring Method of Storage Elastic Modulus of Colored Film for Semiconductor Back Surface>

The storage elastic modulus (tensile storage elastic modulus) of the colored film for semiconductor back surface was determined by preparing a colored film for semiconductor back surface without being laminated on a dicing tape and measuring a storage elastic modulus in a tensile mode under conditions of a sample width of 10 mm, a sample length of 22.5 mm, a sample thickness of 0.2 mm, a frequency of 1 Hz and a temperature elevating rate of 10° C./min under a nitrogen atmosphere at a prescribed temperature (60° C.) using a dynamic viscoelasticity measuring apparatus "Solid Analyzer RS A2", manufactured by Rheometrics Co., Ltd. and was regarded as a value of obtained tensile storage elastic modulus E'.

<Measuring Method of Adhesive Force of Colored Film for Semiconductor Back Surface to Semiconductor Wafer>

A peel force of the colored film for semiconductor back surface to the semiconductor wafer is determined as follows. That is, a silicon wafer as a semiconductor wafer is placed on a hot plate, and a colored film for semiconductor back surface having a length of 150 mm and a width of 10 mm, whose back surface is reinforced with a pressure-sensitive tape (a trade name: BT315, manufactured by Nitto Denko Corporation), was attached thereon at a prescribed temperature (50° C.) by reciprocating a roller of 2 kg at 50° C. once. Thereafter, the laminate is allowed to stand on a hot plate (50° C.) for 2 minutes and then allowed to stand at ordinary temperature (about 23° C.) for 20 minutes. After standing, the back surface-reinforced colored film for semiconductor back surface is peeled (peeled at an interface between the colored film for semiconductor back surface and the semiconductor wafer) at a temperature of 23° C. under conditions of a peel angle of

TABLE 1

|  | Film for semiconductor back surface | Visible light transmittance (%) | Moisture absorbance (% by weight) | Weight decrease ratio (% by weight) |
|---|---|---|---|---|
| Example 1 | Colored film for semiconductor back surface A | 0 | 0.3 | 1.0 |
| Example 2 | Colored film for semiconductor back surface B | 0 | 0.3 | 1.1 |
| Example 3 | Colored film for semiconductor back surface C | 0 | 0.3 | 1.3 |
| Example 4 | Colored film for semiconductor back surface D | 0 | 0.3 | 0.9 |
| Comparative Example 1 | Colored film for semiconductor back surface E | 0 | 0.2 | 0.5 |
| Comparative Example 2 | Colored film for semiconductor back surface F | 0 | 0.4 | 1.5 |

(Evaluation)

With respect to each of the dicing tape-integrated film for semiconductor back surfaces prepared in Examples 1 to 4 and Comparative Examples 1 to 2, an adhesive force of the colored film for semiconductor back surface to the semiconductor wafer, a dicing property, a picking-up property, a flip chip bonding property, a marking property of the semiconductor wafer back surface and an appearance property of the semiconductor wafer back surface were evaluated or measured by 180° and a tensile rate of 300 mm/min by using a peel tester (a trade name: AUTOGRAPH AGS-J, manufactured by Shimadzu Corporation). A maximum load of the load at the peeling time (a maximum value of the load from which a peak top at the beginning of measurement has been eliminated) is measured, and an adhesive force (N/10 nun-width) of the colored film for semiconductor back surface is determined while regarding this maximum load as an adhesive force between the colored film for semiconductor back surface and the semiconductor wafer (adhesive force of the colored film for semiconductor back surface to the semiconductor wafer).

<Evaluation Method of Dicing Property and Picking-Up Property>

By using each of the dicing tape-integrated film for semiconductor back surfaces of Examples 1 to 4 and Comparative Examples 1 to 2, the dicing property was evaluated by actually dicing a semiconductor wafer, and thereafter, a peeling property was evaluated, thereby evaluating a dicing performance and a picking-up performance of the dicing tape-integrated film for semiconductor back surface.

A semiconductor wafer (diameter: 8 inches, thickness: 0.6 mm; a silicon mirror wafer) was subjected to a back surface polishing treatment, and a mirror wafer having a thickness of 0.2 mm was used as a workpiece. After the separator was peeled from the dicing tape-integrated film for semiconductor back surface, the mirror wafer (workpiece) was attached onto the colored film for semiconductor back surface by roller press-bonding at 60° C., and dicing was further performed. Herein, the dicing was performed as full cut so as to be a chip size of 10 mm in square. In this regard, conditions for semiconductor wafer grinding, attaching conditions and dicing conditions are as follows.

(Conditions for Semiconductor Wafer Grinding)
Grinding apparatus: trade name "DFG-8560" manufactured by DISCO Corporation Semiconductor wafer: 8 inch diameter (back surface was ground so as to be until a thickness of 0.2 mm from a thickness of 0.6 mm)
(Attaching Conditions)
Attaching apparatus: trade name "MA-3000II" manufactured by Nitto Seiki Co., Ltd.
Attaching speed: 10 mm/min
Attaching pressure: 0.15 MPa
Stage temperature at the time of attaching: 60° C.
(Dicing Conditions)
Dicing apparatus: trade name "DFD-6361" manufactured by DISCO Corporation
Dicing ring: "2-8-1" (manufactured by DISCO Corporation)
Dicing speed: 30 mm/sec
Dicing blade:
  Z1; "203O-SE 27HCDD" manufactured by DISCO Corporation
  Z2; "203O-SE 27HCBB" manufactured by DISCO Corporation
Dicing blade rotation speed:
  Z1; 40,000 r/min
  Z2; 45,000 r/min
Cutting method: step cutting
Wafer chip size: 10.0 mm square In the dicing, it was confirmed whether the mirror wafer (workpiece) was firmly held on the dicing tape-integrated film for semiconductor back surface without peeling to effect the dicing satisfactory or not. The case where the dicing was well performed was ranked "Good" and the case where the dicing was not well performed was ranked "Bad", thus the dicing ability being evaluated.

Next, the semiconductor chip obtained by dicing was peeled from the pressure-sensitive adhesive layer of the dicing tape together with the film for flip chip type semiconductor back surface by pushing up the semiconductor chip from the dicing tape side of the dicing tape-integrated film for semiconductor back surface with a needle, whereby the semiconductor chip in a state where the back surface had been protected with the film for semiconductor back surface was picked up. The picking-up ratio (%) of the chips (400 pieces in total) on this occasion was determined to evaluate the picking-up property. Therefore, the picking-up property is better when the picking-up ratio is closer to 100%.

Here, the picking-up conditions are as follows.
(Picking-Up Conditions for Semiconductor Wafer)
Picking-up apparatus: trade name "SPA-300" manufactured by Shinkawa Co., Ltd.
Number of picking-up needles: 9 needles
Pushing-up speed of needle: 20 mm/s
Pushing-up distance of needle: 500 μm
Picking-up time: 1 second
Dicing tape-expanding amount: 3 mm <Evaluation Method for Flip Chip Bonding Property>

On the semiconductor chip according to each of the Examples and Comparative Examples obtained by the above-mentioned <Evaluation method of dicing properties/picking-up property>using the dicing tape-integrated film for semiconductor back surface according to each of the Examples and Comparative Examples, a bump formed at the circuit face of the semiconductor chip was brought into contact with a conductive material (solder) attached to a connecting pad of the circuit board in a form where the surface (circuit face) of the semiconductor chip was opposed to the surface of the circuit board possessing a wiring corresponding to the circuit face, and the conductive material was melted under pressure by raising the temperature to 260° C. and then cooled to room temperature, whereby the semiconductor chip was fixed to the circuit board to manufacture a semiconductor device. The flip chip bonding property on this occasion was evaluated according to the following evaluation standard.

(Evaluation Standard for Flip Chip Bonding Property)
Good: Mounting could be achieved by the flip chip bonding method with no trouble;
Bad: Mounting could not be achieved by the flip chip bonding method.

<Evaluation Method for Marking Property of Wafer Back Surface>

Laser marking was applied on the back surface of the semiconductor chip (i.e., the surface of the colored film for semiconductor back surface) in the semiconductor device obtained by the above-mentioned <Evaluation method for flip chip bonding property> with using YAG laser. On the information obtained by the laser marking (bar-code information), the laser marking property of the semiconductor device obtained using the dicing tape-integrated film for semiconductor back surface according to each of the Examples and Comparative Examples was evaluated according to the following evaluation standard.

(Evaluation Standard for Laser Marking Property)
Good: The number of persons who judged the information obtained by the laser marking satisfactorily visible was 8 persons or more among randomly selected 10 adult persons;
Bad: The number of persons who judged the information obtained by the laser marking satisfactorily visible was 7 persons or less among randomly selected 10 adult persons.

<Evaluation Method for Appearance Property of Wafer Back Surface>

On the semiconductor chip according to each of the Examples and Comparative Examples obtained by the above-mentioned <Evaluation method of dicing property/picking-up property> using the dicing tape-integrated film for semiconductor back surface according to each of the Examples and Comparative Examples, the appearance property of the back surface of the semiconductor chip was visually evaluated according to the following evaluation standard.

(Evaluation Standard for Appearance Properties>

Good: No peeling (lifting) was observed between the back surface of the wafer (silicon wafer) and the film for semiconductor back surface in the semiconductor chip;

Bad: Peeling (lifting) was observed between the back surface of the wafer (silicon wafer) and the film for semiconductor back surface in the semiconductor chip.

TABLE 2

| | Thermoplastic resin (wt %) | Adhesive force (N/10 mm-width) | Dicing property | Picking-up property (%) | Flip chip bonding property | Laser marking property | Appearance property |
|---|---|---|---|---|---|---|---|
| Example 1 | 1.23 | 8.3 or more | Good | 100 | Good | Good | Good |
| Example 2 | 1.34 | 8.3 or more | Good | 100 | Good | Good | Good |
| Example 3 | 0.9 | 4.3 | Good | 100 | Good | Good | Good |
| Example 4 | 4.2 | 8.3 or more | Good | 100 | Good | Good | Good |
| Comparative Example 1 | 16.5 | 0 | Bad | Bad | Bad | Bad | Bad |
| Comparative Example 2 | 0.078 | 8.3 or more | Good | Bad | Bad | Bad | Bad |

It can be seen from Table 2 that the dicing tape-integrated films for semiconductor back surface according to Examples 1 to 4 have a function as a dicing tape and functions as a colored film for semiconductor back surface on excellent levels.

In the dicing tape-integrated film for semiconductor back surface of the invention, not only the dicing tape and the film for semiconductor back surface are formed in an integrated form, but the storage elastic modulus (at 60° C.) of the film for semiconductor back surface is from 0.9 MPa to 15 MPa. Therefore, the dicing tape-integrated film for semiconductor back surface of the invention can be utilized from a dicing step of a semiconductor wafer to a flip chip bonding step of a semiconductor chip. That is the dicing tape-integrated film for semiconductor back surface of the invention can be suitably used as a dicing tape-integrated film for semiconductor back surface provided with both functions as a dicing tape and a film for semiconductor back surface at manufacturing a semiconductor device by a flip chip bonding method.

While the present invention has been described in detail and with reference to specific embodiments thereof, it will be apparent to one skilled in the art that various changes and modifications can be made therein without departing from the scope thereof.

This application is based on Japanese patent application No. 2009-142231 filed Jun. 15, 2009 and Japanese patent application No. 2010-103964 filed Apr. 28, 2010, the entire contents thereof being hereby incorporated by reference.

What is claimed is:

1. A process for producing a semiconductor device using a dicing tape-integrated film for semiconductor back surface which is a non-circuit face, comprising a dicing tape including a base material and a pressure-sensitive adhesive layer provided on the base material; and a film for flip chip type semiconductor back surface, provided on the pressure-sensitive adhesive layer, wherein the film for flip chip type semiconductor back surface has a storage elastic modulus (at 60° C.) of from 0.9 MPa to 15 MPa, the process comprising: attaching a workpiece onto the film for flip chip type semiconductor back surface of the dicing tape-integrated film for semiconductor back surface, dicing the workpiece to form a chip-shaped workpiece, peeling the chip-shaped workpiece from the pressure-sensitive adhesive layer of the dicing tape together with the film for flip chip type semiconductor back surface, flip chip connecting the chip-shaped workpiece onto an adherend by fixing the chip- shaped workpiece to the adherend in a form where a circuit face of the chip-shaped workpiece is opposed to the adherent, and filling a gap formed between the opposing faces of the workpiece and the adherend with encapsulating resin.

2. A flip chip-mounted semiconductor device, which is manufactured by the process according to claim 1.

3. The process for producing a semiconductor device using the dicing tape-integrated film for semiconductor back surface according to claim 1, wherein the film for flip chip type semiconductor back surface contains a coloring agent added thereto.

4. The process for producing a semiconductor device using a dicing tape-integrated film for semiconductor back surface according to claim 1, wherein the workpiece is a semiconductor wafer and the chip-shaped workpiece is a semiconductor chip.

* * * * *